United States Patent
Kim et al.

(10) Patent No.: US 9,666,434 B2
(45) Date of Patent: May 30, 2017

(54) METHOD FOR FORMING FINE PATTERNS OF SEMICONDUCTOR DEVICE

(71) Applicant: SAMSUNG ELECTRONICS CO., LTD., Suwon-si, Gyeonggi-do (KR)

(72) Inventors: Jaehee Kim, Yongin-si (KR);
Dae-Yong Kang, Suwon-si (KR);
SoonMok Ha, Hwaseong-si (KR);
Joonsoo Park, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/064,628

(22) Filed: Mar. 9, 2016

(65) Prior Publication Data
US 2016/0307755 A1   Oct. 20, 2016

(30) Foreign Application Priority Data

Apr. 17, 2015   (KR) .......................... 10-2015-0054295

(51) Int. Cl.
*H01L 21/311*   (2006.01)
*H01L 21/033*   (2006.01)
*H01L 21/768*   (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/76816* (2013.01); *H01L 21/76877* (2013.01)

(58) Field of Classification Search
CPC .................................................. H01L 21/0338

USPC .......................................................... 438/696
See application file for complete search history.

(56) References Cited

U.S. PATENT DOCUMENTS

| | | | |
|---|---|---|---|
| 7,811,940 B2 | 10/2010 | Sandhu | |
| 8,263,323 B2 | 9/2012 | Yoon et al. | |
| 8,486,489 B2 | 7/2013 | Cheng et al. | |
| 8,486,512 B2 | 7/2013 | Black et al. | |
| 8,497,201 B2 | 7/2013 | Lee et al. | |
| 8,592,940 B2* | 11/2013 | Sandhu | H01L 21/0332 257/506 |
| 8,771,929 B2 | 7/2014 | Guillorn et al. | |
| 9,099,399 B2 | 8/2015 | Park et al. | |
| 2011/0117744 A1 | 5/2011 | Ito | |
| 2014/0127910 A1 | 5/2014 | Hieno et al. | |
| 2016/0042965 A1 | 2/2016 | Ha et al. | |

FOREIGN PATENT DOCUMENTS

| | | | |
|---|---|---|---|
| KR | 10-2015-0042378 A | 4/2015 | |
| KR | 10-2016-0019979 A | 2/2016 | |

* cited by examiner

*Primary Examiner* — Roberts Culbert
(74) *Attorney, Agent, or Firm* — Lee & Morse, P.C.

(57) ABSTRACT

A method for forming fine patterns includes patterning a hard mask layer on an etch target layer to form sacrificial pillars and a first opening disposed between the sacrificial pillars and exposing the etch target layer, forming a block copolymer layer on the etch target layer exposed through the first opening, phase-separating the block copolymer layer to form first block patterns spaced apart from the sacrificial pillars and a second block pattern, forming first holes by etching the etch target layer exposed by removing the first block patterns, and forming second holes in the etch target layer exposed by removing the sacrificial pillars, the second holes being different from the first holes.

20 Claims, 31 Drawing Sheets

METHOD FOR FORMING FINE PATTERNS OF SEMICONDUCTOR DEVICE

CROSS-REFERENCE TO RELATED APPLICATION

Korean Patent Application No. 10-2015-0054295, filed on Apr. 17, 2015, in the Korean Intellectual Property Office, and entitled: "Method for Forming Fine Patterns of Semiconductor Device," is incorporated by reference herein in its entirety.

BACKGROUND

1. Field

Embodiments relate to a method for forming fine patterns of a semiconductor device.

2. Description of the Related Art

As electronic products may be miniaturized and semiconductor devices may be highly integrated, lithography techniques for forming nano-sized fine patterns may be increasingly demanded to manufacture semiconductor memory devices and logic circuits. Due to, for example, the limitation of resolution of lithography techniques, it may be difficult to realize nano-sized fine patterns by lithography techniques.

SUMMARY

Embodiments may be realized by providing a method for forming fine patterns, the method including patterning a hard mask layer on an etch target layer to form sacrificial pillars and a first opening between the sacrificial pillars, the first opening exposing the etch target layer; forming a block copolymer layer on the etch target layer exposed through the first opening, the block copolymer layer including first and second polymer blocks; phase-separating the block copolymer layer to form first block patterns and a second block pattern, the first block patterns spaced apart from the sacrificial pillars, the first block patterns including the first polymer block, the second block pattern surrounding the sacrificial pillars and the first block patterns, and the second block pattern including the second polymer block; forming first holes by etching the etch target layer exposed by removing the first block patterns; and forming second holes by etching the etch target layer exposed through second openings formed by removing the sacrificial pillars, the second holes being different from the first holes.

Forming the second holes may include forming a coating layer exposing the sacrificial pillars on the etch target layer in which the first holes are formed; removing the sacrificial pillars to form the second openings; conformally forming a spacer layer along a profile of the second openings and the coating layer; and forming the second holes in the etch target layer by anisotropically etching the spacer layer to expose a top surface of the coating layer.

Forming the second holes in the etch target layer may include anisotropically etching the spacer layer to expose at least a portion of the etch target layer; and etching the exposed etch target layer to form the second holes.

One or more of a thickness of the spacer layer and sizes of the sacrificial pillars may be controlled to adjust sizes of the second holes.

The hard mask layer may be patterned using a photolithography process defining a mask pattern.

Concentrations of the first polymer block and the second polymer block may be controlled to adjust sizes of the first holes.

The etch target layer may be on a substrate including a first region and a second region surrounding the first region, the sacrificial pillars and the first opening may be on the substrate of the first region, and a portion of the hard mask layer may remain on the substrate of the second region.

The hard mask layer may include a first sub-hard mask layer and a second sub-hard mask layer that are sequentially stacked, and the sacrificial pillars may correspond to portions of the first sub-hard mask layer, respectively.

Patterning the hard mask layer may include forming mask patterns on the hard mask layer; etching the second and first sub-hard mask layers using the mask patterns as etch masks; and removing the second sub-hard mask layer and the mask patterns, the second sub-hard mask layer and the mask patterns being on the sacrificial pillars.

Removing the second sub-hard mask layer and the mask patterns may include exposing the first sub-hard mask layer of the second region.

The first block patterns may be in only the first region.

The first sub-hard mask layer may include silicon, silicon oxide, poly-silicon, silicon oxynitride, silicon nitride, silicon carbonitride, and/or silicon carbide.

The second sub-hard mask layer may include a spin-on-hardmask layer and/or an amorphous carbon layer.

Each of the first block patterns may be between at least three sacrificial pillars adjacent to each other.

Each of the first block patterns may have a cylindrical shape.

Embodiments may be realized by providing a method for forming a first block pattern and a second block pattern on an etch target layer, the method including forming a block copolymer layer on the etch target layer between pillars on the etch target layer, the block copolymer including a first polymer block and a second polymer block, the pillars including one or more silicon-based materials; and dividing the block copolymer layer into a region including the first polymer block and another region including the second polymer block using a thermal treatment process.

The molar volume ratio of the first polymer block to the second polymer block may be in a range of 0.2:0.8 to 0.35:0.65, and the region including the first polymer block may surround the region including the second polymer block.

Embodiments may be realized by providing a method for etching an etch target layer, the method including forming a block copolymer layer on an etch target layer, the block copolymer including a first polymer block and a second polymer block; dividing the block copolymer layer into a region including the first polymer block and regions including the second polymer block; removing the regions including the second polymer block to form empty regions, portions of the etch target layer being exposed through the empty regions; and etching the etch target layer using the region including the first polymer block as an etch mask to form first holes in the etch target layer at the empty regions.

Removing the regions including the second polymer block to form empty regions may include using one or more of an oxygen plasma treatment, an ozone treatment, an ultraviolet irradiation treatment, a pyrolysis treatment, and a chemical decomposition treatment.

The molar volume ratio of the first polymer block to the second polymer block may be in a range of 0.2:0.8 to 0.35:0.65, and the region including the first polymer block may surround the regions including the second polymer block.

BRIEF DESCRIPTION OF THE DRAWINGS

Features will become apparent to those of skill in the art by describing in detail exemplary embodiments with reference to the attached drawings in which:

FIGS. 1A to 12A illustrate plan views of a method for forming fine patterns according to an embodiment;

FIGS. 1B to 12B illustrate cross-sectional views taken along lines I-I' of FIGS. 1A to 12A, respectively;

FIGS. 1C to 12C illustrate cross-sectional views taken along lines II-II' of FIGS. 1A to 12A, respectively;

DETAILED DESCRIPTION

Figure 1A:
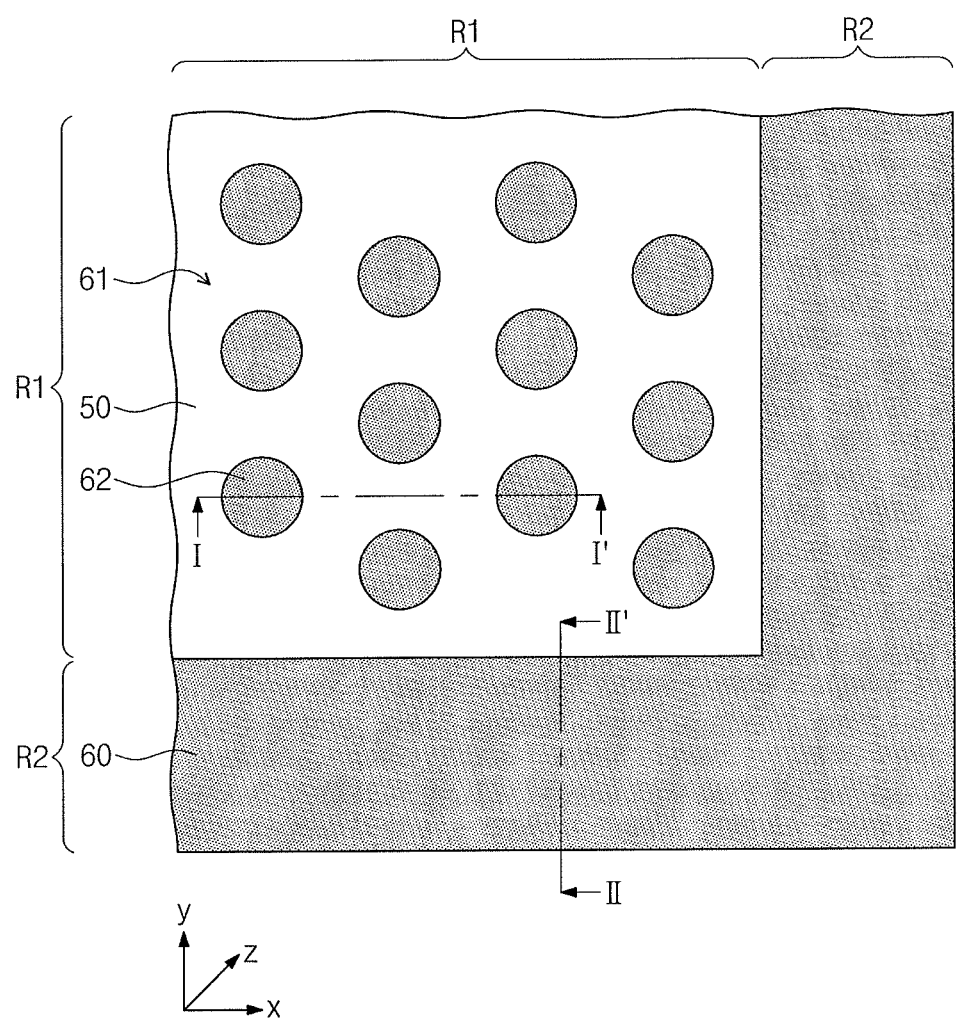

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. Similarly, it will be understood that when an element such as a layer, region or substrate is referred to as being "on" another element, it can be directly on the other element or intervening elements may be present. In contrast, the term "directly" means that there are no intervening elements. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and groups thereof. It will be also understood that although the terms first, second, third, etc., may be used herein to describe various elements, these elements should not be limited by these terms. These terms are only used to distinguish one element from another element. Thus, a first element in some embodiments could be termed a second element in other embodiments.

Additionally, embodiments in the detailed description will be described with cross-sectional views, plan views and/or perspective views as ideal exemplary views. In the drawings, thicknesses of layers and regions may be exaggerated for clarity. Accordingly, shapes of the exemplary views may be modified according to manufacturing techniques and/or allowable errors. Therefore, embodiments are not limited to the specific shape illustrated in the exemplary views, but may include other shapes that may be created according to manufacturing processes. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. Like reference numerals refer to like elements throughout.

A block copolymer may be one of polymer materials capable of forming a nano structure by self-assembly. The block copolymer may have a molecular structure formed of polymer blocks that are chemically different from each other and are connected to each other by a covalent bond. The block copolymer may form various nano structures (e.g., spheres, cylinders, or lamellas) with the regularity of 5 nm to 50 nm by the self-assembly. When the block copolymer is synthesized, sizes and properties of the self-assembled nano structures may be controlled by controlling kinds and composition ratios of monomers and/or molecular weights of polymers. The block copolymer may form nano structures having a long range order by a parallel type process, the nano structures formed of the block copolymer may be used as a template capable of being easily removed, and the technique using the block copolymer may be spotlighted as a patterning technique for forming fine patterns in various fields such as information technology (IT), biology technology ( , and environment technology (ET).

FIGS. 1A to 12A illustrate plan views of a method for forming fine patterns according to an embodiment. FIGS. 1B to 12B illustrate cross-sectional views taken along lines I-I' of FIGS. 1A to 12A, respectively. FIGS. 1C to 12C illustrate cross-sectional views taken along lines II-II' of FIGS. 1A to 12A, respectively. Hereinafter, the method for forming fine patterns according to an embodiment will be described in detail with reference to FIGS. 1A to 12A, 1B to 12B, and 1C to 12C.

Figure 1B:
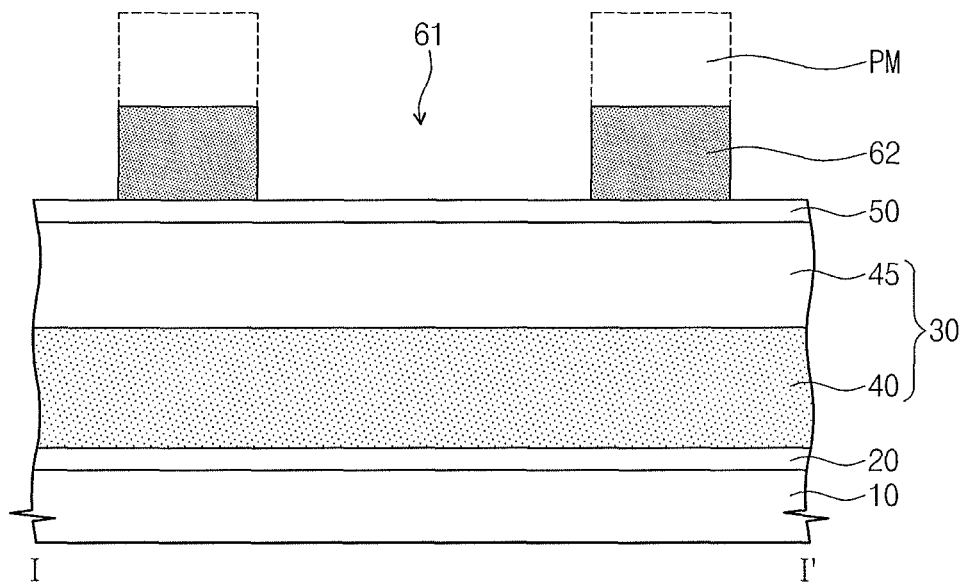
Figure 1C:
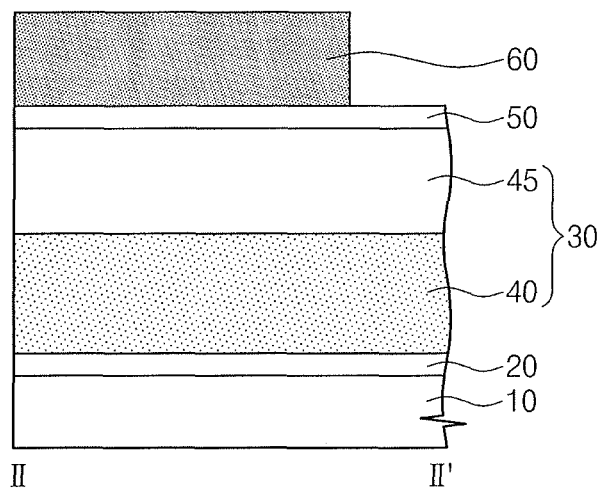
Figure 2A:
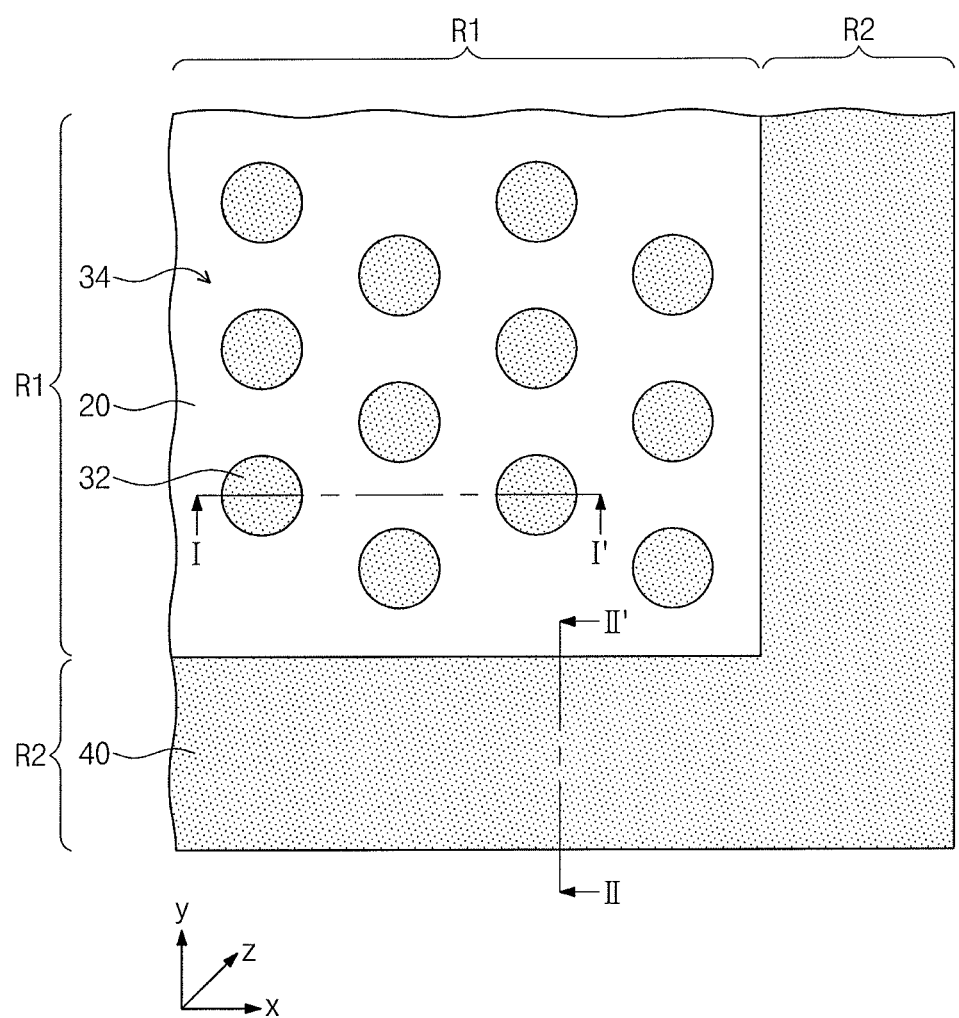
Figure 2B:
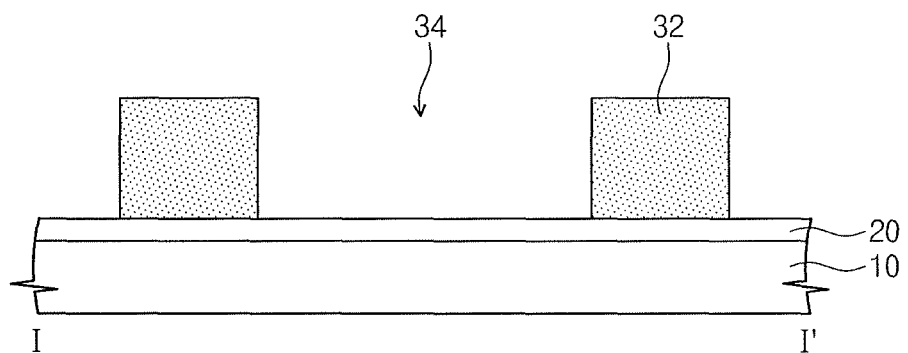
Figure 2C:
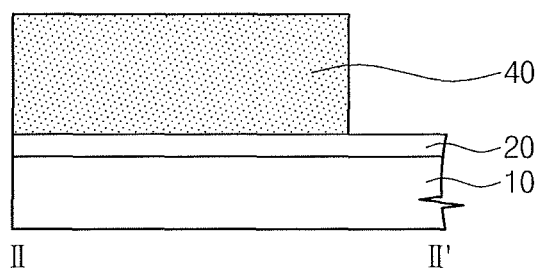

Referring to FIGS. 1A, 1B, and 1C, a substrate 10 including a first region R1 and a second region R2 may be provided. Fine patterns may be formed in the first region R1, and the second region R2 may surround the first region R1 when viewed from a plan view. In an embodiment, the first region R1 may be a cell region in which memory cells are formed, and the second region R2 may be a peripheral region surrounding the cell region. An etch target layer 20, a hard mask layer 30, and an anti-reflection layer 50 may be sequentially formed on the substrate 10.

The etch target layer 20 may be formed of one or more of a semiconductor material, a conductive material, and an insulating material. In an embodiment, if the etch target layer 20 is formed of the semiconductor material, the etch target layer 20 may be, for example, a portion of a semiconductor substrate or an epitaxial layer. In an embodiment, if the etch target layer 20 is formed of the conductive material, the etch target layer 20 may be formed of one or more of, for example, doped poly-silicon, a metal silicide, a metal, and a metal nitride. In an embodiment, if the etch target layer 20 is foamed of the insulating material, the etch target layer 20 may be formed of one or more of, for example, silicon oxide, silicon nitride, silicon oxynitride, and a low-k dielectric material having a low dielectric constant. In an embodiment, the etch target layer 20 may be formed of one or more of crystalline silicon, amorphous silicon, silicon doped with dopants, silicon-germanium (SiGe), and a carbon-based material layer. The etch target layer 20 may be formed of a single layer, or a multi-layer including a plurality of stacked layers. For example, the etch target layer 20 may include a plurality of stacked insulating layers and/or a conductive layer or semiconductor layer disposed between the stacked insulating layers.

The hard mask layer 30 may include a first sub-hard mask layer 40 and a second sub-hard mask layer 45, which may be sequentially stacked. The hard mask layer 30 may include a material having an etch selectivity with respect to the etch target layer 20. The first sub-hard mask layer 40 may include one or more of silicon-based materials such as silicon, silicon oxide ($SiO_2$), poly-silicon, silicon oxynitride (SiON), silicon nitride ($Si_3N_4$), silicon carbonitride (SiCN), and silicon carbide (SiC). In an embodiment, the first sub-hard mask layer 40 may include one or more of other inorganic materials. The second sub-hard mask layer 45 may be formed of a material having an etch selectivity with respect to the first sub-hard mask layer 40. For example, the second sub-hard mask layer 45 may include a spin-on-hardmask (SOH) layer or an amorphous carbon layer (ACL). The SOH layer may include a carbon-based SOH layer or a silicon-based SOH layer. A thickness of the hard mask layer 30 may be changed according to a thickness and/or a material of the etch target layer 20. In an embodiment, the hard mask layer 30 may be a single layer, or a multi-layer including three or more layers sequentially stacked.

The anti-reflection layer 50 may be formed on the hard mask layer 30. The anti-reflection layer 50 may reduce the amount of light lost by reflection during a photolithography process. The anti-reflection layer 50 may be formed of a material capable of preventing the second sub-hard mask layer 45 from being etched. The anti-reflection layer 50 may include one or more of silicon-based materials such as silicon oxynitride (SiON), silicon, silicon oxide ($SiO_2$), poly-silicon, silicon nitride ($Si_3N_4$), silicon carbonitride (SiCN), and silicon carbide. In an embodiment, the anti-reflection layer 50 may include one or more of other inorganic materials.

Referring continuously to FIGS. 1A, 1B, and 1C, mask patterns 62 and 60 may be formed on the anti-reflection layer 50. The mask patterns 62 and 60 may include first mask patterns 62 formed in the first region R1 and a second mask pattern 60 formed in the second region R2. A space between the first mask patterns 62 in the first region R1 may be defined as a first empty region 61. The first empty region 61 may expose a portion of the anti-reflection layer 50 of the first region R1. The second mask pattern 60 may cover the anti-reflection layer 50 of the second region R2.

According to an embodiment, the mask patterns 62 and 60 may be formed using a photolithography process. Forming the mask patterns 62 and 60 may include forming a mask layer on the anti-reflection layer 50, forming photoresist patterns PM on the mask layer by the lithography process, and etching the mask layer using the photoresist patterns PM as etch masks. Before the formation of the photoresist patterns PM, an additional anti-reflection layer may be formed on the mask layer. In an embodiment, a width and a pitch of the first mask patterns 62 may be determined according to a resolution of the photolithography process for forming the photoresist patterns PM.

As illustrated in FIG. 1A, each of the first mask patterns 62 may have an island shape (e.g., a circular shape) when viewed from a plan view. In an embodiment, the first mask patterns 62 may be arranged in a honeycomb form or a zigzag form when viewed from a plan view. The first mask patterns 62 may be arranged in a direction z diagonal to first and second directions x and y perpendicular to each other when viewed from a plan view.

Referring to FIGS. 1B, 2A, 2B, and 2C, the anti-reflection layer 50 and the hard mask layer 30 may be etched using the mask patterns 62 and 60 as etch masks to form a first opening 34. Thereafter, the mask patterns 62 and 60, the anti-reflection layer 50 and the second sub-hard mask layer 45 which remain on the substrate 10 may be removed to form sacrificial pillars 32. The mask patterns 62 and 60, the anti-reflection layer 50, and the second sub-hard mask layer 45 may be removed in sequence or at the same time, and the sacrificial pillars 32 and the first opening 34 may be formed in the first region R1. The sacrificial pillars 32 may be portions of the first sub-hard mask layer 40, which may be respectively disposed at positions overlapping with the first mask patterns 62 in a plan view. The first opening 34 may correspond to a space between the sacrificial pillars 32. A portion of the etch target layer 20 of the first region R1 may be exposed through the first opening 34. Since the second mask pattern 60 protects the first sub-hard mask layer 40 of the second region R2, the first sub-hard mask layer 40 of the second region R2 may remain after the formation of the sacrificial pillars 32. In an embodiment, if the mask patterns 62 and 60 are formed of a photoresist layer, a SOH layer or an amorphous carbon layer (ACL), the mask patterns 62 and 60 may be removed using an ashing process and/or a strip process.

Figure 3A:
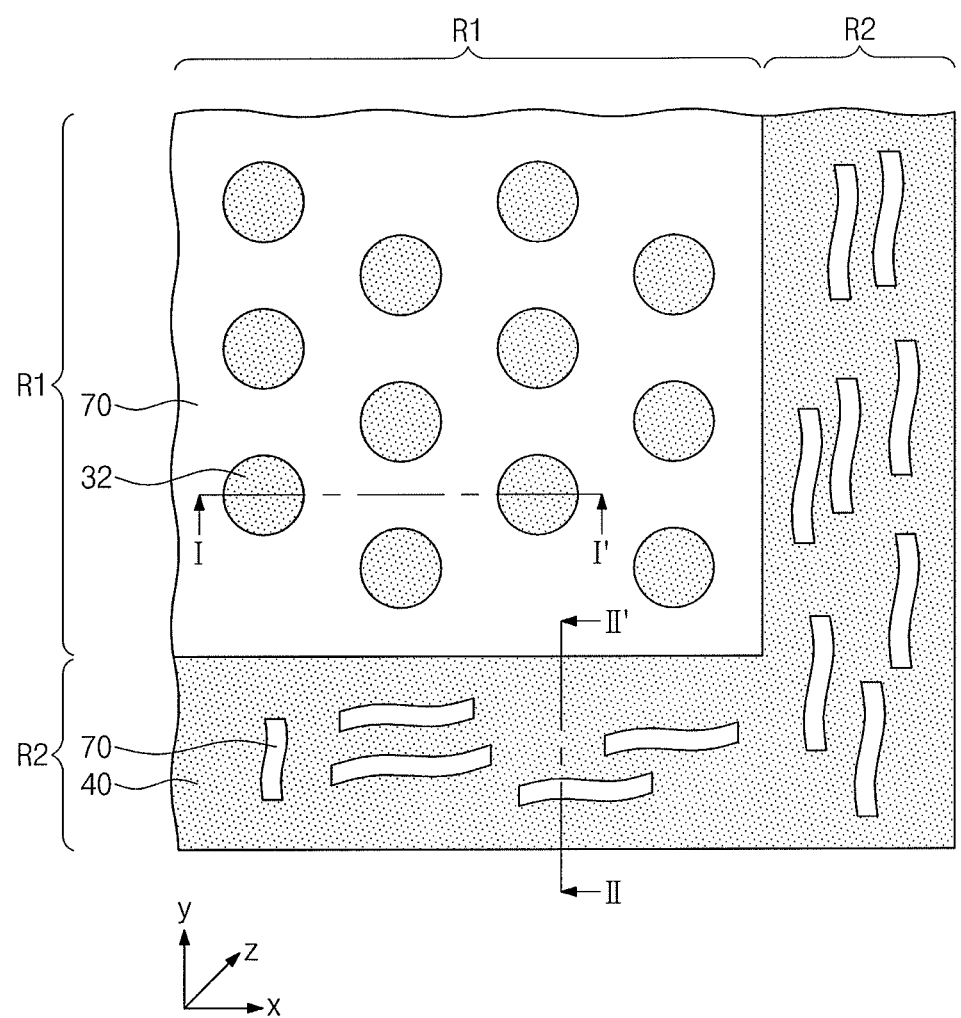
Figure 3B:
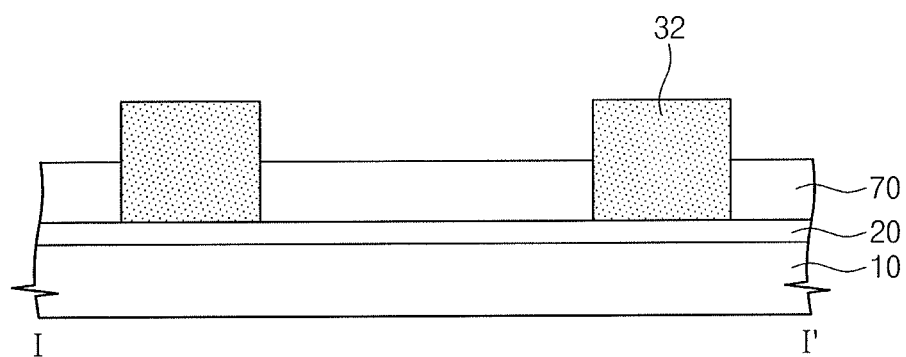
Figure 3C:
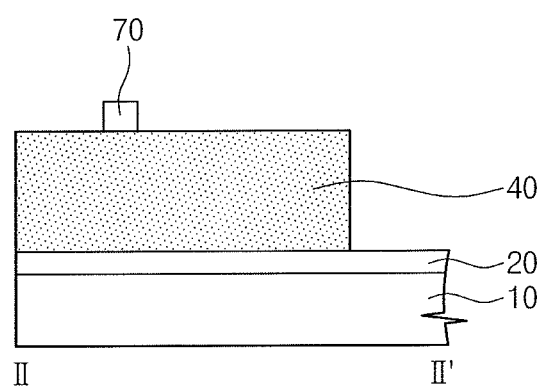

Referring to FIGS. 3A, 3B, and 3C, a block copolymer layer 70 may be formed on the etch target layer 20 exposed through the first opening 34. The block copolymer layer 70 may be formed in the first region R1. In an embodiment, a portion of the block copolymer 70 may also be formed in the second region R2 by characteristics of the process of forming the block copolymer layer 70. The block copolymer layer 70 may include a copolymer including two or more polymer blocks of which first ends are connected to each other by a covalent bond. At this time, second ends of the two or more polymer blocks may be repulsive to each other. In an embodiment, the block copolymer layer 70 may include a first polymer block and a second polymer block, which may be combined with each other by the covalent bond. The block copolymer layer 70 may be in a homogeneous state where the first and second polymer blocks are randomly located. As described above, the first and second polymer blocks may be connected to each other by the covalent bond. The first and second polymer blocks may be formed of monomers different from each other, and properties of the first and second polymer blocks may be different from each other.

For example, the first polymer block may have a hydrophilic property, and the second polymer block may have a hydrophobic property. In an embodiment, the first polymer block may have the hydrophobic property, and the second polymer block may have the hydrophilic property. For example, the block copolymer layer 70 may include one or more of, for example, polystyrene-poly(methyl methacrylate) block copolymer (PS-b-PMMA), polystyrene-poly(methyl acrylate) block copolymer, polystyrene-poly(ethyl methacrylate) block copolymer, polystyrene-poly(t-butyl methacrylate) block copolymer, polystyrene-poly(methacrylic acid) block copolymer, polystyrene-poly(butoxy methacrylate) block copolymer, polystyrene-poly(ethyl acrylate) block copolymer, polystyrene-poly(acrylic acid) block copolymer, polystyrene-polybutadiene block copolymer (PS-b-PBD), polystyrene-polyisoprene block copolymer (PS-b-PI), polystyrene-poly(ethylene-propylene) block copolymer (PS-b-PEP), polystyrene-polydimethylsiloxane block copolymer (PS-b-PDMS), polystyrene-polyethylene block copolymer (PS-b-PE), polystyrene-polyvinylpyridine block copolymer (PS-b-P4VP), polystyrene-poly(ethylene oxide) block copolymer (PS-b-PEO), poly(ethylene oxide)-polyisoprene block copolymer (PEO-b-PI), poly(ethylene oxide)-polybutadiene block copolymer (PEO-b-PBD), poly(ethylene oxide)-poly(methyl methacrylate) block copolymer (PEO-b-PMMA), poly(ethylene oxide)-polyethylene ethylene block copolymer (PEO-b-PEE), polystyrene-poly(ferrocenyl dimethylsilane) block copolymer (PS-b-PFS), polybutadiene-polyvinylpyridine block copolymer (PBD-b-PVP), polyisoprene-poly(methyl methacrylate) block copolymer (PI-b-PMMA), and poly(2-vinylpyridine)-polydimethylsiloxane block copolymer (P2VP-b-PDMS). The block copolymer layer 70 may include the first and second polymer blocks, which may be randomly mixed with each other. In an embodiment, the block copolymer layer 70 may be divided into a region including the first polymer block and another region including the second polymer block by a phase-separation process using a thermal treatment process. The separated regions may have sphere structures, cylinder structures, or lamella structures according to a molar volume ratio of the first and second polymer blocks.

When the phases of the block copolymer layer 70 are separated from each other, a repetition interval of the separated regions may be varied according to an average molecular weight of the first polymer block. For example, the repetition interval of the separated regions may correspond to a distance between cylinders or a sum of thicknesses of an A layer and a B layer in an ABAB lamella structure. In an embodiment, the repetition interval of the separated regions may increase as the average molecular weight of the first polymer block increases. A size of the separated phase (e.g., a diameter of the sphere, a diameter of the cylinder, or a thickness of the lamella layer) may also be varied according to the average molecular weight of the first polymer block. The size of the separated phase may increase as the average molecular weight of the first polymer block increases.

Figure 4A:
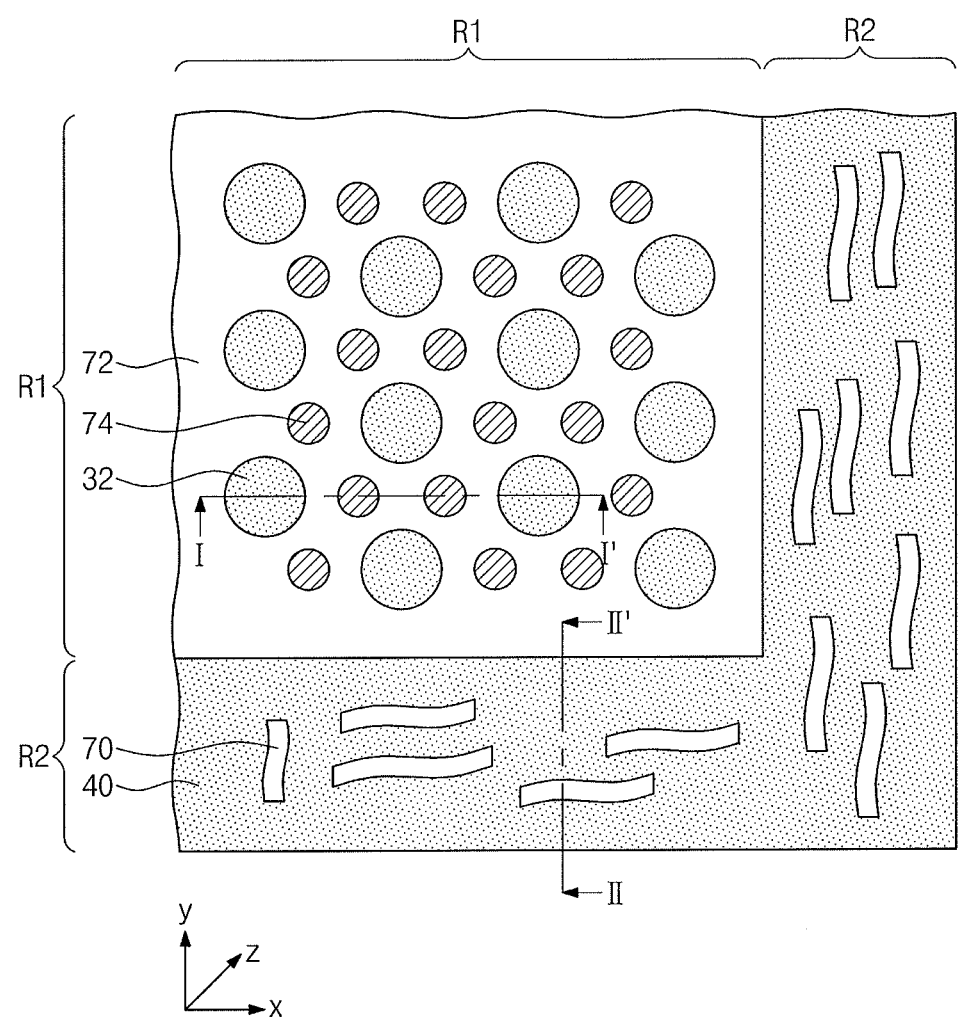
Figure 4B:
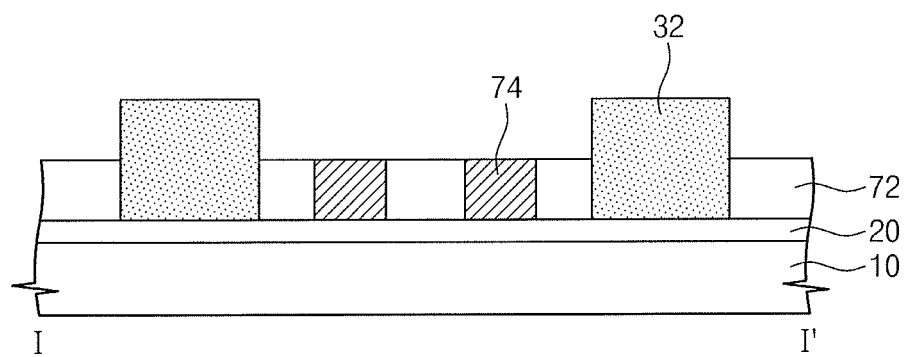
Figure 4C:
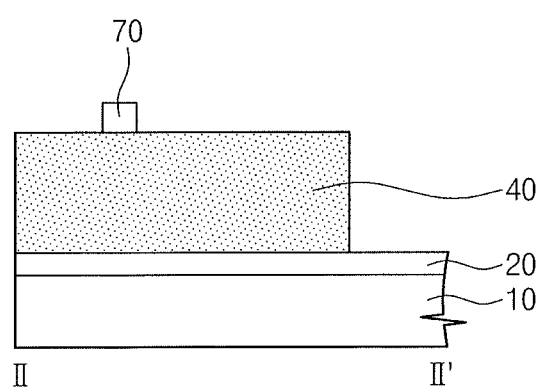

Referring to FIGS. 4A, 4B, and 4C, the block copolymer layer 70 of FIGS. 3A and 3B may be phase-separated to form a first block pattern 72 and second block patterns 74. The first block pattern 72 may include the first polymer block, and the second block patterns 74 may include the second polymer block. The phase-separation process may be performed by thermally treating the block copolymer layer 70 of FIGS. 3A and 3B at a temperature of 150 degrees Celsius to 350 degrees Celsius. Since the sacrificial pillars 32 include the inorganic material, the sacrificial pillars 32 may not be damaged by the thermal treatment. Shapes of the first block pattern 72 and the second block patterns 74 formed by the phase-separation process may be varied according to the molar volume ratio of the first and second polymer blocks. If the molar volume ratio of the first polymer block to the second polymer block is in a range of 0.2:0.8 to 0.35:0.65, the block copolymer layer 70 may be phase-separated such that the second block patterns 74 have cylinder shapes and the first block pattern 72 surrounds the second block patterns 74, as illustrated in FIGS. 4A and 4B. Each of the second block patterns 74 may be formed among at least three sacrificial pillars 32 adjacent to each other. The at least three sacrificial pillars 32 may be two-dimensionally arranged. For example, the at least three sacrificial pillars 32 may be disposed at vertexes of a triangle, respectively. If the sacrificial pillars 32 are omitted, it may be difficult to control positions and the arrangement of the second block patterns 74. According to embodiments, the second block patterns 74 may have a substantially uniform pitch due to, for example, the sacrificial pillars 32. The first block pattern 72 and the second block patterns 74 may be formed in the first region R1. The first sub-hard mask layer 40 may remain throughout the second region R2, and the first block pattern 72 and the second block patterns 74 may not be formed in the second region R2.

Figure 5A:
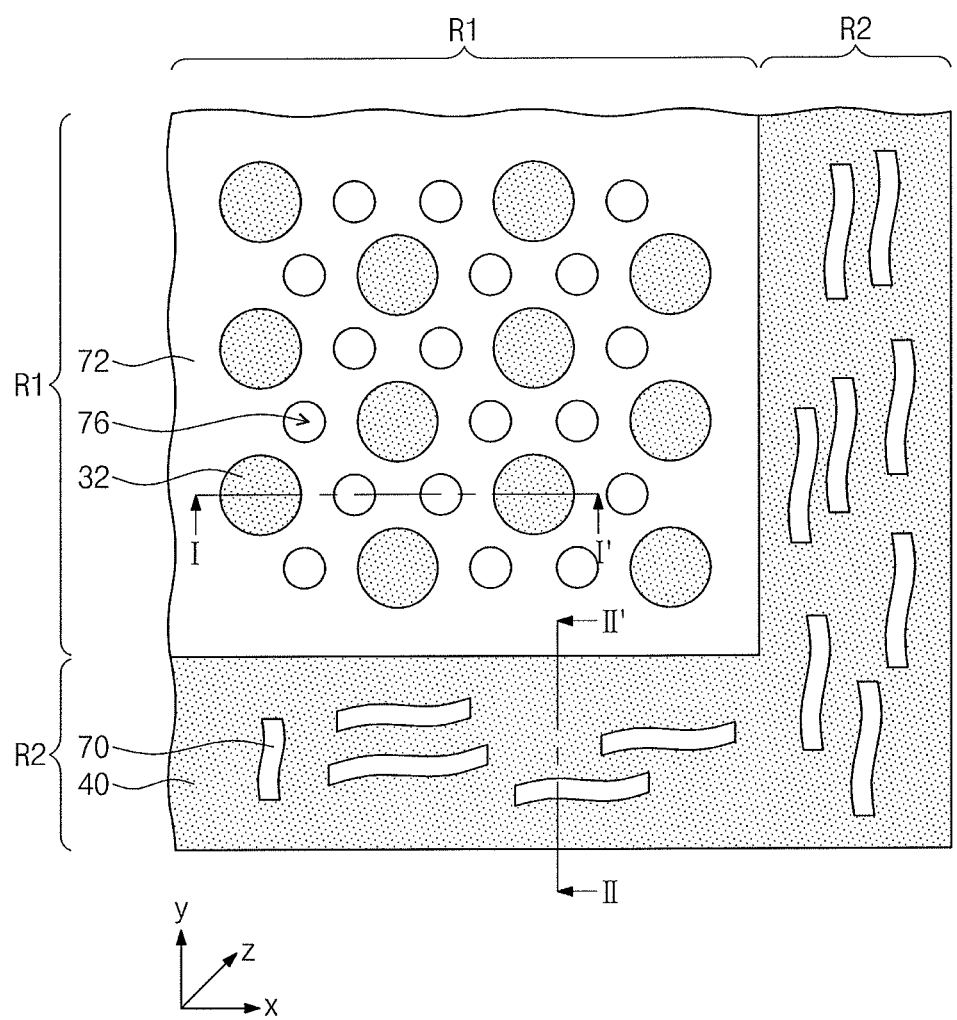
Figure 5B:
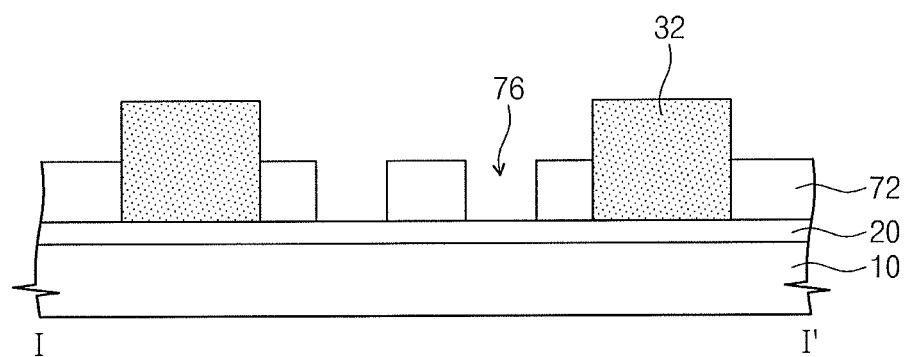
Figure 5C:
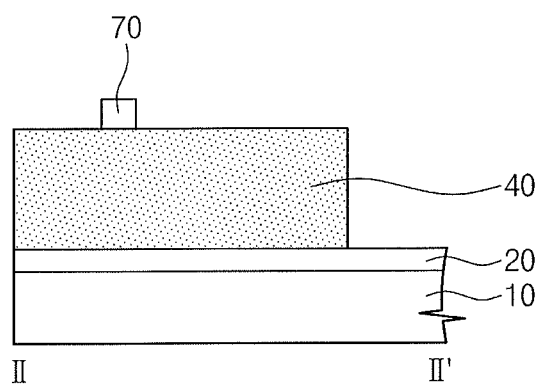

Referring to FIGS. 5A, 5B, and 5C, the second block patterns 74 may be removed to form second empty regions 76. Portions of the etch target layer 20 may be exposed through the second empty regions 76. The method of removing the second block patterns 74 may be suitably selected according to a constituent of the second block patterns 74. In an embodiment, the second block patterns 74 may be removed using an oxygen plasma treatment, an ozone treatment, an ultraviolet (UV) irradiation treatment, a pyrolysis treatment, a chemical decomposition treatment, or any combination thereof. In an embodiment, the second block patterns 74 may be removed by a wet development process or a dry development process.

Figure 6A:
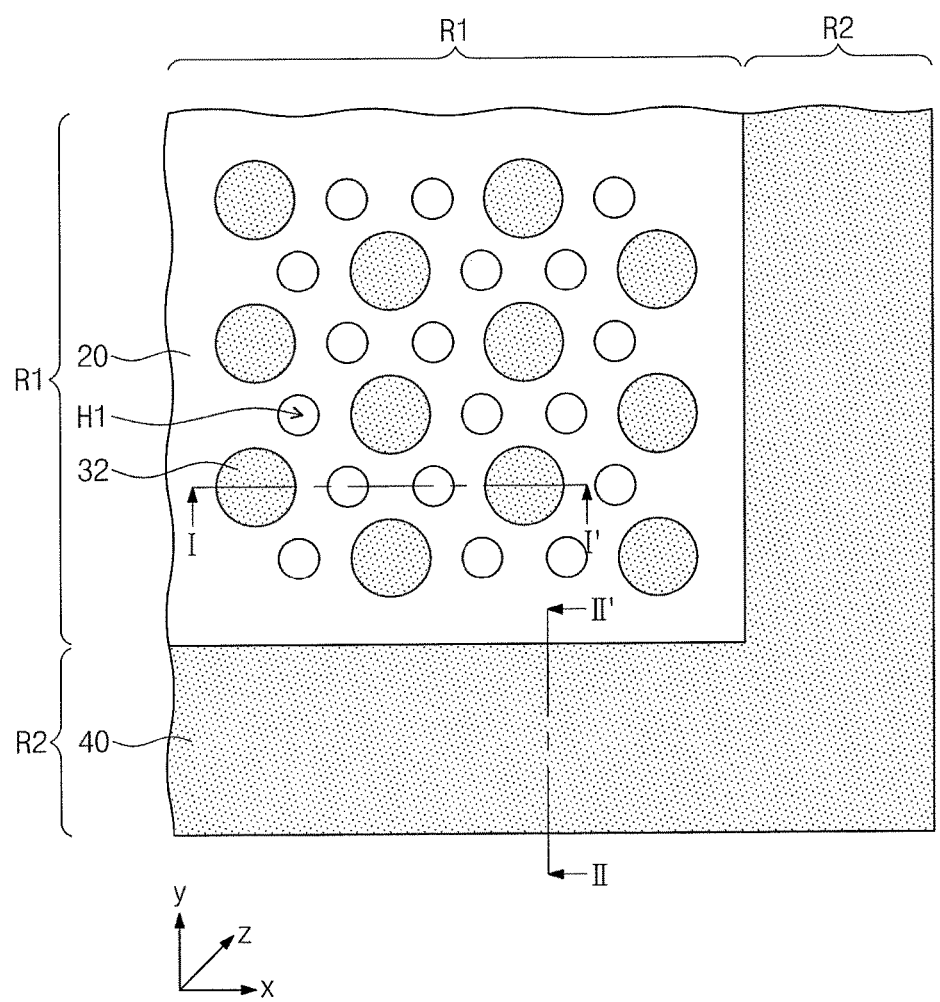
Figure 6B:
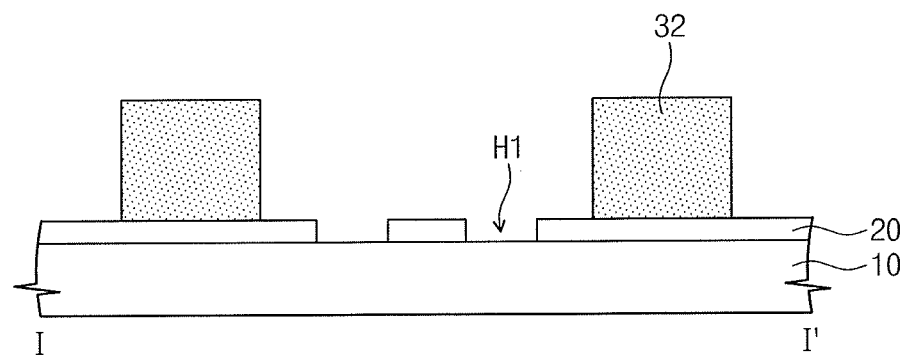
Figure 6C:
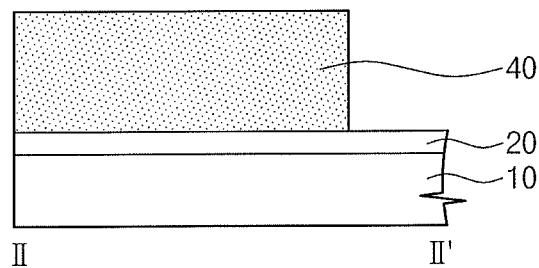

Referring to FIGS. 6A, 6B, and 6C, the etch target layer 20 may be etched using the first block pattern 72 having the second empty regions 76 as an etch mask to form first holes H1 in the etch target layer 20. Portions of the etch target layer 20 may be exposed through the first holes H1. At this time, the etch target layer 20 of the second region R2 may not be etched due to, for example, the first sub-hard mask layer 40. The first block pattern 72 may be removed after the formation of the first holes H1. At this time, the block copolymer layer 70 remaining in the second region R2 may also be removed. The method of removing the first block pattern 72 may be suitably selected according to a constituent of the first block pattern 72. In an embodiment, the first block pattern 72 may be removed using an oxygen plasma treatment, an ozone treatment, an UV irradiation treatment, a pyrolysis treatment, a chemical decomposition treatment, or any combination thereof. In an embodiment, the first block pattern 72 may be removed by a wet development process or a dry development process.

Figure 7A:
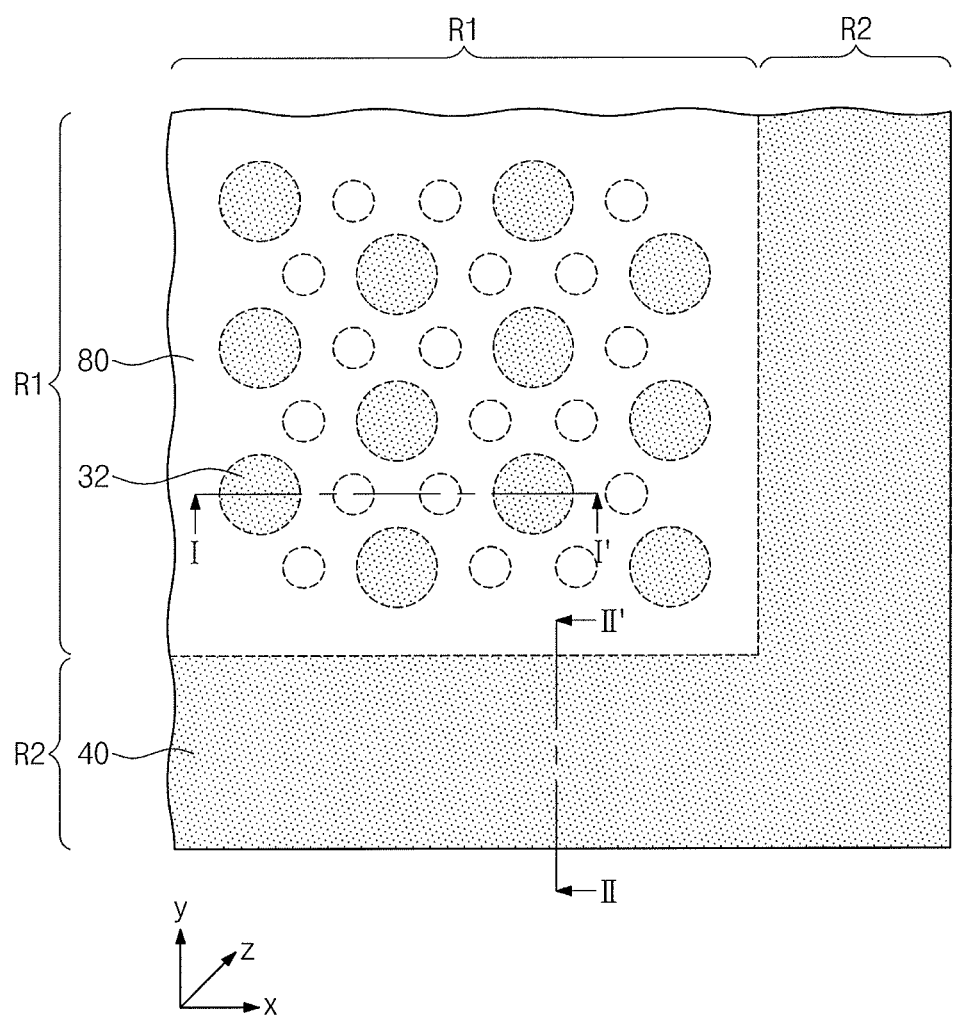
Figure 7B:
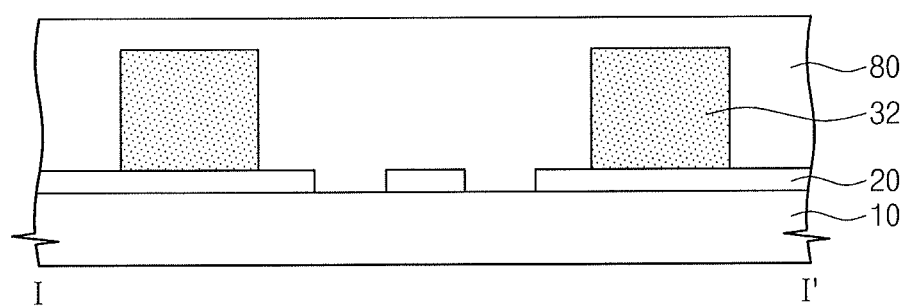
Figure 7C:
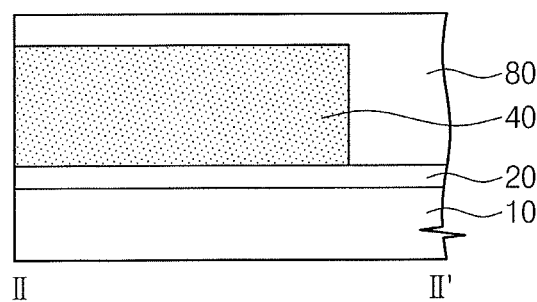

Referring to FIGS. 7A, 7B, and 7C, next, a coating layer 80 may be coated on the substrate 10 of the first and second regions R1 and R2. The coating layer 80 may be coated to cover the sacrificial pillars 32 and the first sub-hard mask layer 40, which may be disposed on the etch target layer 20. The coating layer 80 may include a SOH layer. For example, the coating layer 80 may include a carbon-based SOH layer or a silicon-based SOH layer.

Figure 8A:
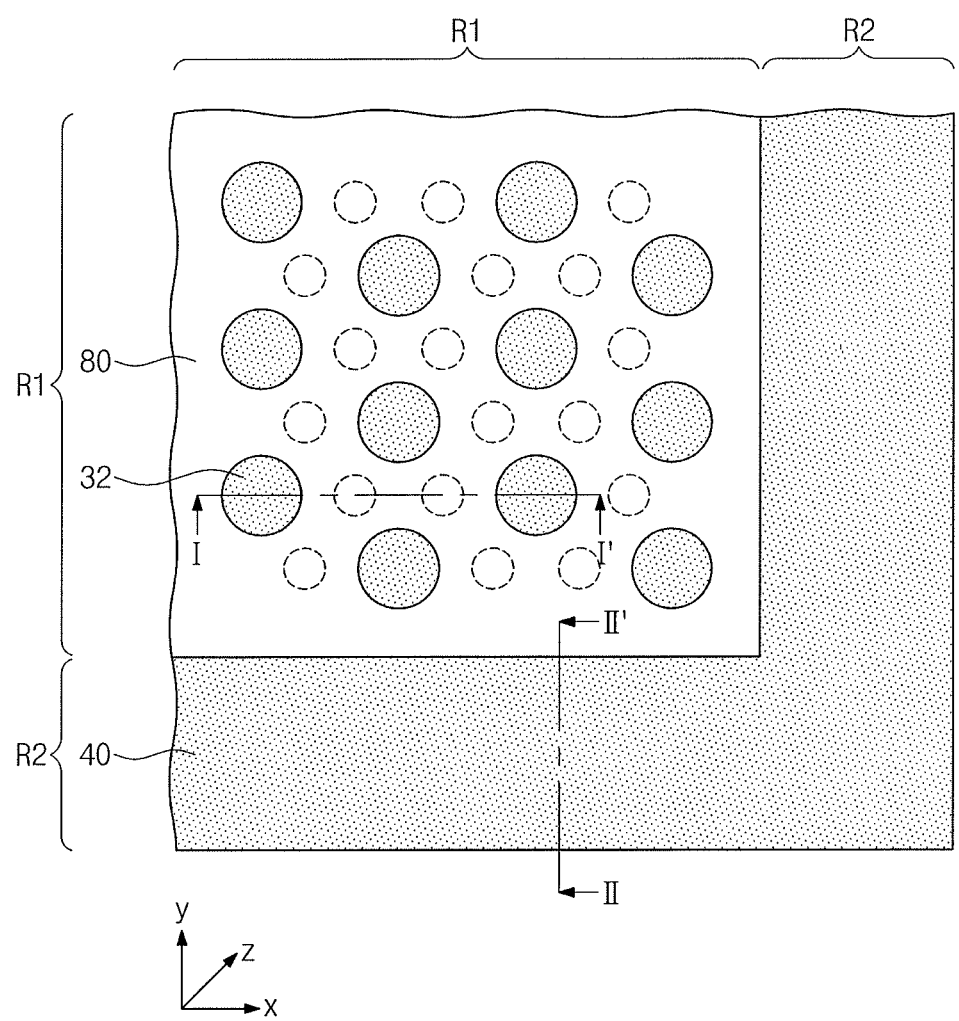
Figure 8B:
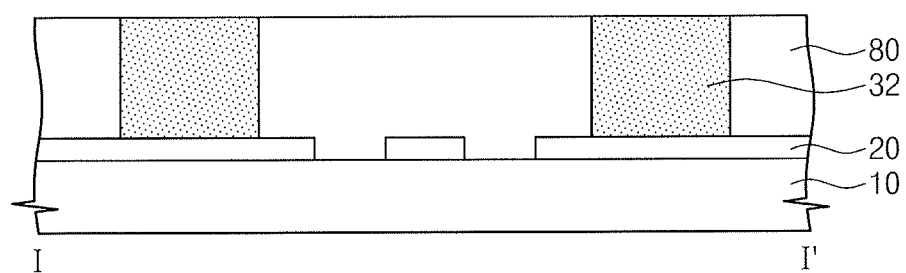
Figure 8C:
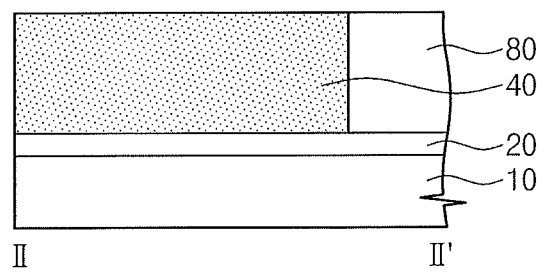

Next, referring to FIGS. 8A, 8B, and 8C, an anisotropic etching process (e.g., an etch-back process) may be performed on the coating layer 80 until top surfaces of the sacrificial pillars 32 are exposed, and after the anisotropic etching process, the sacrificial pillars 32 may be exposed in the first region R1 when viewed from a plan view. At this time, a top surface of the first sub-hard mask layer 40 may be exposed in the second region R2.

Figure 9A:
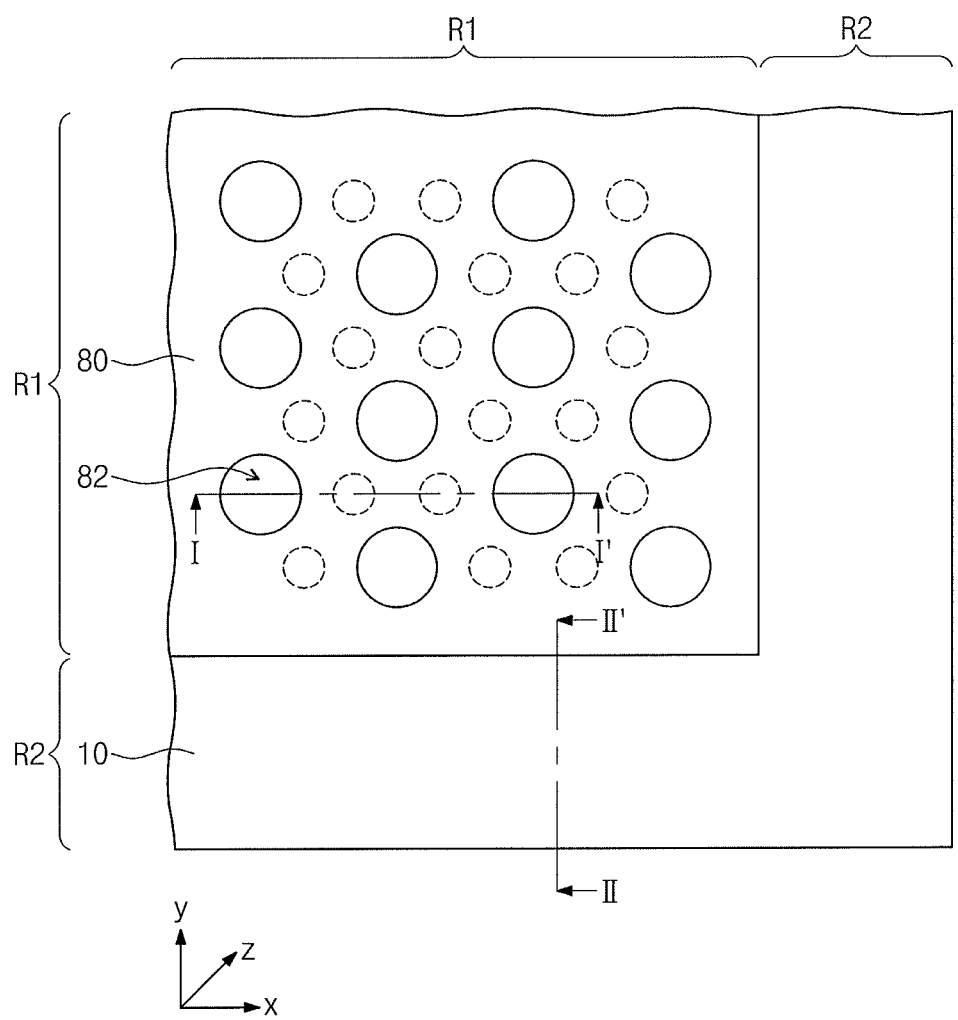
Figure 9B:
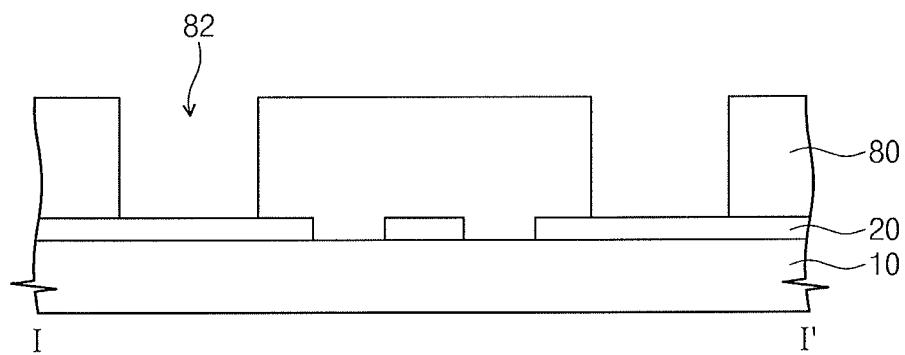
Figure 9C:
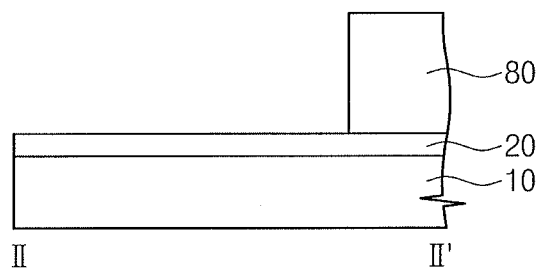

Referring to FIGS. 9A, 9B, and 9C, subsequently, the sacrificial pillars 32 of the first region R1 may be removed to form second openings 82. At this time, the first sub-hard mask layer 40 of the second region R2 also may be removed. The method of removing the sacrificial pillars 32 may be suitably selected according to a constituent of the sacrificial pillars 32. In an embodiment, the sacrificial pillars 32 may be removed using an etching process, an oxygen plasma treatment, an ozone treatment, an UV irradiation treatment, a pyrolysis treatment, a chemical decomposition treatment, or any combination thereof.

Figure 10A:
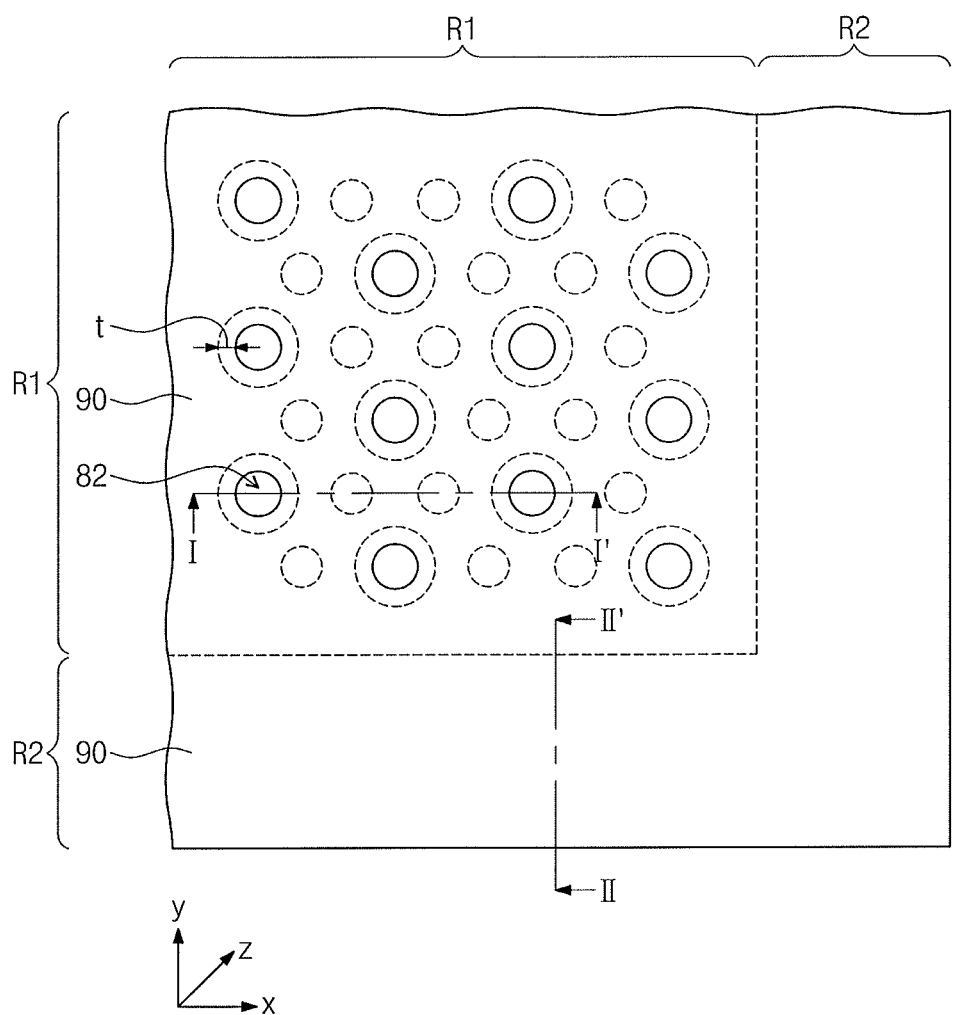
Figure 10B:
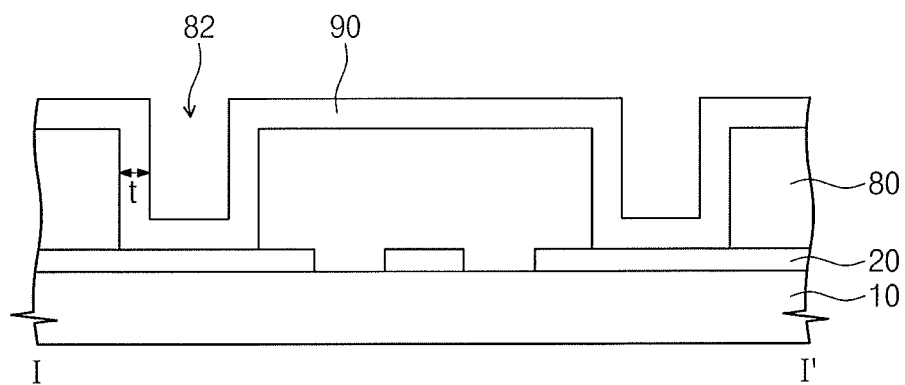
Figure 10C:
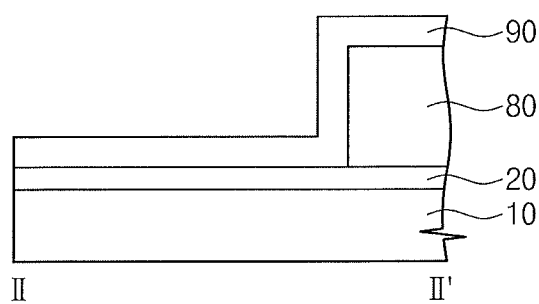

Referring to FIGS. 10A, 10B, and 10C, a spacer layer 90 may be formed along profiles of the second openings 82 and the coating layer 80. The spacer layer 90 may be conformally formed on inner surfaces of the second openings 82 and a top surface of the coating layer 80. The spacer layer 90 may be deposited using a deposition technique such as a chemical vapor deposition (CVD) technique and/or an atomic layer deposition (ALD) technique. The spacer layer 90 may have a substantially uniform thickness t.

Figure 11A:
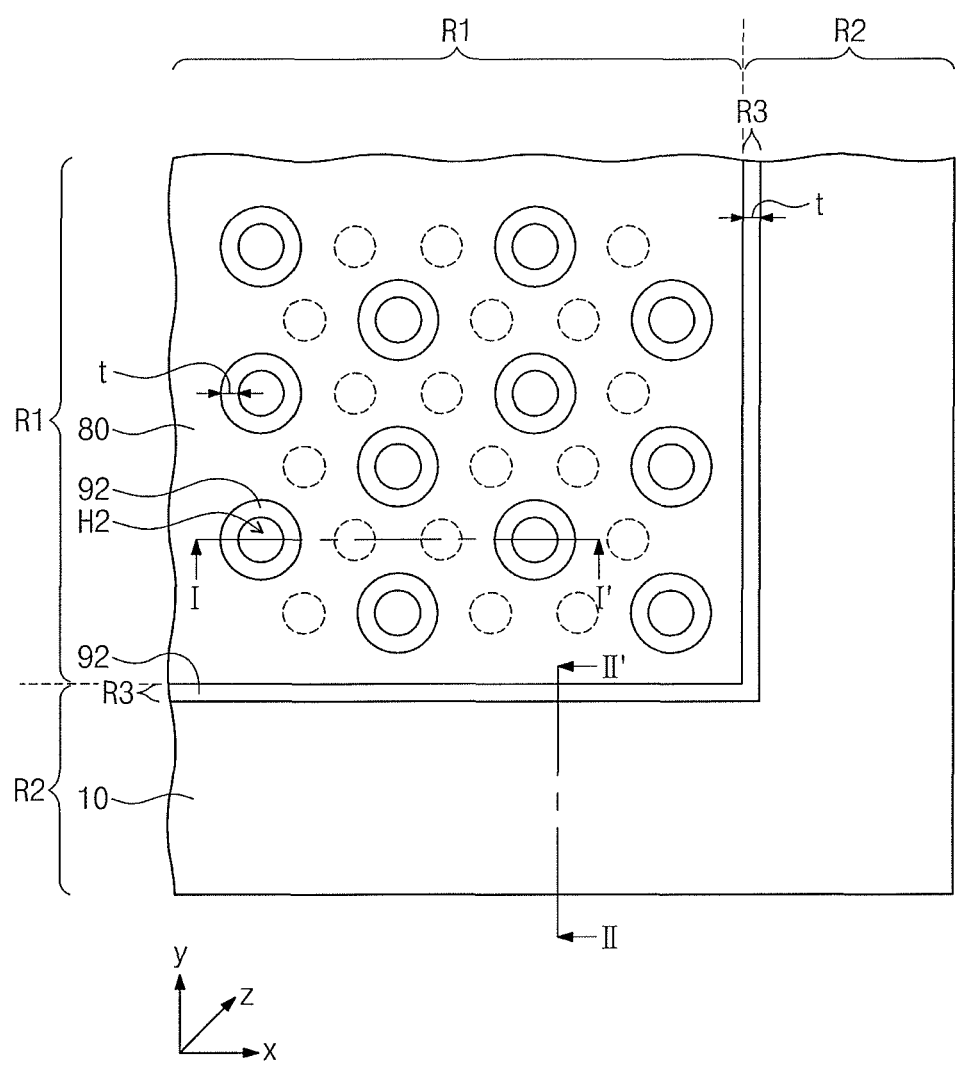
Figure 11B:
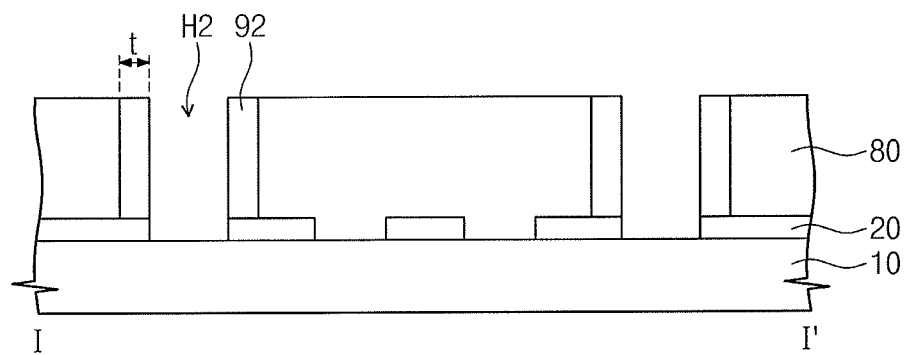
Figure 11C:
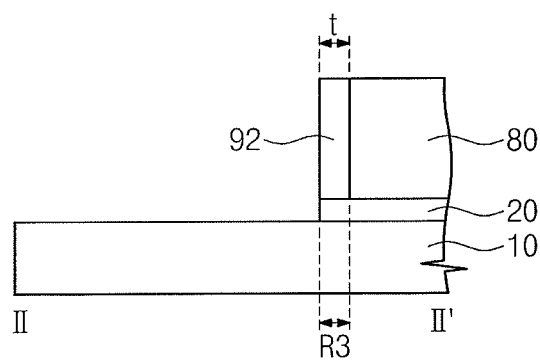

Referring to FIGS. 11A, 11B, and 11C, an anisotropic etching process (e.g., an etch-back process) may be performed on an entire top surface of the spacer layer 90 until the top surface of the coating layer 80 is exposed, and spacers 92 may be formed in the second openings 82, respectively. The etch target layer 20 exposed by the second openings 82 having the spacers 92 may be etched, and second holes H2 may be formed in the first region R1 when viewed from a plan view. The second holes H2 may penetrate the etch target layer 20. The first and second holes H1 and H2 may correspond to fine patterns. Sizes and widths of the second holes H2 may be controlled by controlling the thickness t of the spacer layer 90. At this time, the spacer layer 90 and the etch target layer 20 of the second region R2 may also be etched. At this time, a third region R3 may be formed at a boundary between the first and second regions R1 and R2 by the spacer 92. A width of the third region R3 may be substantially equal to the thickness t of the spacer 92 disposed on a sidewall of the coating layer 80.

Figure 12A:
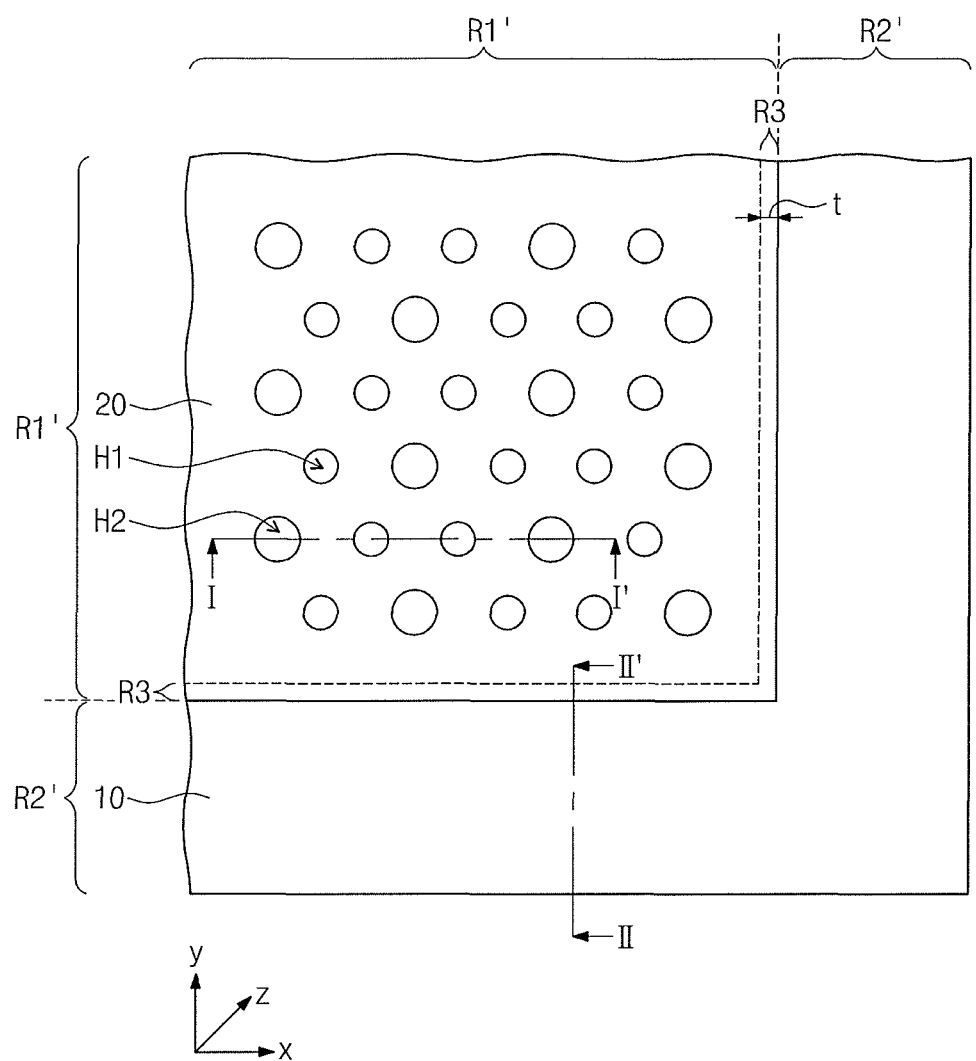
Figure 12B:
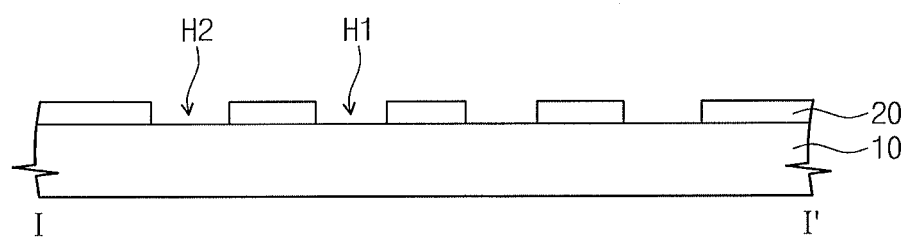
Figure 12C:
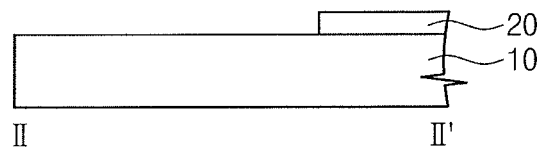

Referring to FIGS. 12A, 12B, and 12C, the coating layer 80 and the spacers 92 remaining on the etch target layer 20 may be removed, and the etch target layer 20 including the first holes H1 and the second holes H2 may remain on the substrate 10. A first region R1' may include the third region R3, and an area of the first region R1' may be increased and an area of a second region R2' may be reduced. Thus, an extra area of the first region R1' may be increased and an overlay margin may be increased in a subsequent process (e.g., a dicing process), and process efficiency may be improved. The area of the third region R3 may be controlled by adjusting the thickness t of the spacer layer 90, and the area of the first region R1' may be controlled.

In the aforementioned method for forming the fine patterns of the semiconductor device, the sizes of the first holes H1 may be adjusted by controlling concentrations of the first and second polymer blocks of the block copolymer layer 70. The sizes of the second holes H2 may be adjusted by controlling the thickness t of the spacer layer 90 and/or the sizes of the sacrificial pillars 32, and the sizes of the first holes H1 may be adjusted independently of the sizes of the second holes H2. Furthermore, the area of the first region R1' may be increased to improve the overlay margin of a process (e.g., a trimming process).

In the aforementioned method for forming the fine patterns of the semiconductor device, since a single photolithography process may be performed, the fine patterns may be economically and easily formed, and a manufacture cost of the semiconductor device may be reduced and manufacture processes of the semiconductor device may be simplified. The etch target layer 20 on the substrate 10 may be finally etched in the embodiment described above. In an embodiment, the substrate 10 may be finally etched. Furthermore, the structure described above was described as an example for the purpose of ease and convenience in explanation. In an embodiment, each of the elements may include more stacked layers.

A method for manufacturing a semiconductor device using the method for forming fine patterns according to the aforementioned embodiment will be described hereinafter. In the present specification, the semiconductor device may include a highly-integrated semiconductor memory device (e.g., a dynamic random access memory (DRAM), a static RAM (SRAM), a phase change RAM (PRAM), a resistance RAM (RRAM), a magnetic RAM (MRAM), a ferroelectric RAM (FRAM), or a flash memory), a micro electro mechanical system (MEMS) device, an optoelectronic device, and/or a processor (e.g., a central processing unit (CPU) or a digital single processor (DSP). In an embodiment, the semiconductor device may consist of the same kind of semiconductor devices. In an embodiment, the semiconductor device may be a single-chip data processing device such as a system-on-chip (SOC) including different kinds of semiconductor devices, which may be necessary to provide one complete function.

Hereinafter, a semiconductor memory device manufactured using the method for forming fine patterns according to an embodiment will be described with reference to FIGS. 13 to 15.

Figure 13:
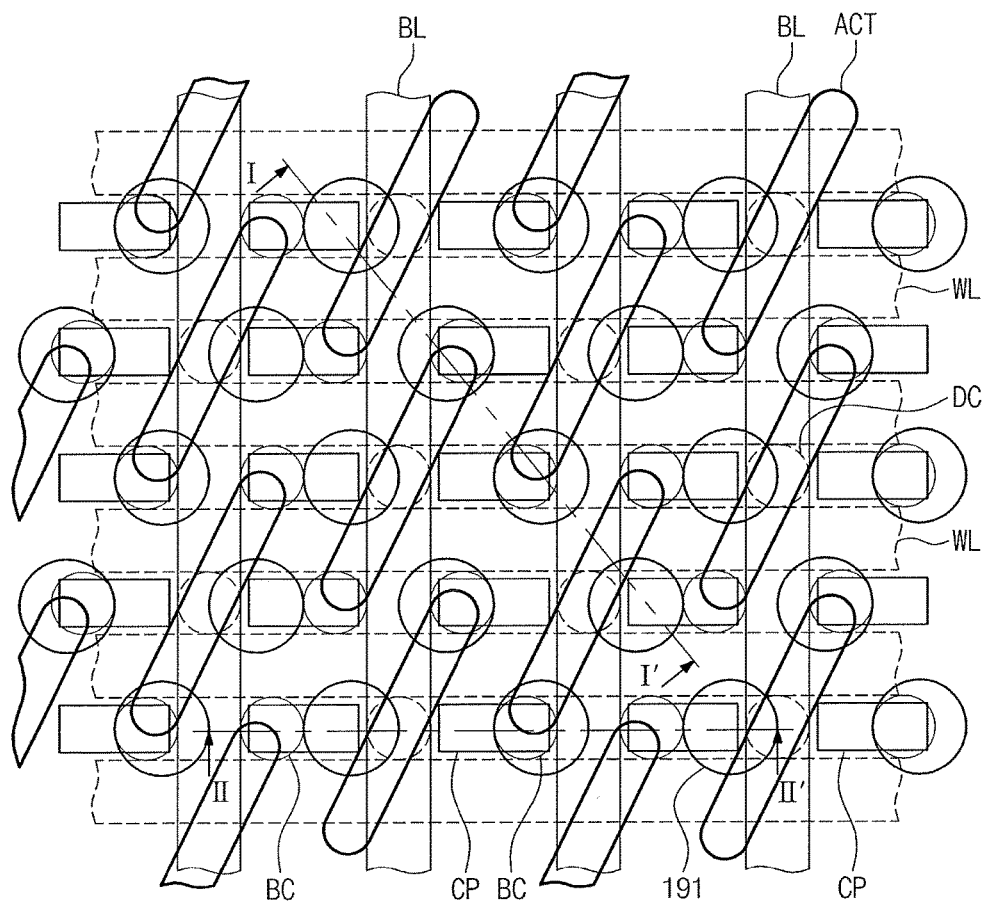
FIG. 13 illustrates a plan view of a semiconductor memory device manufactured using the method for forming fine patterns according to an embodiment.

FIG. 13 illustrates a plan view of a semiconductor memory device manufactured using the method for forming fine patterns according to an embodiment. FIGS. 14 and 15 illustrate cross-sectional views taken lines I-I' and II-II' of FIG. 13 to illustrate a method for manufacturing a semiconductor memory device using the method for forming fine patterns according to an embodiment.

Figure 14:
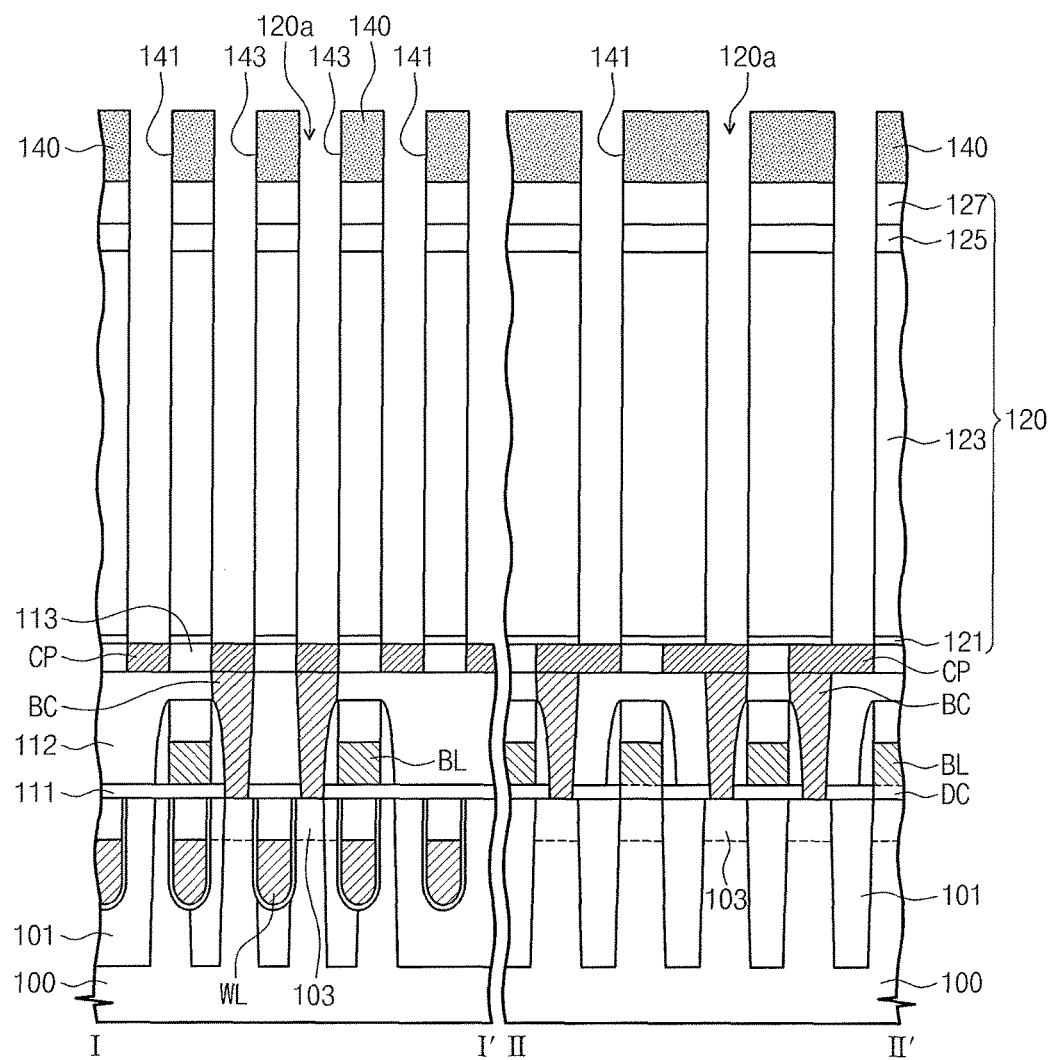
FIGS. 14 and 15 illustrate cross-sectional views taken lines I-I' and II-II' of FIG. 13 to illustrate a method for manufacturing a semiconductor memory device using the method for forming fine patterns according to an embodiment.

Referring to FIGS. 13 and 14, a semiconductor memory device may include word lines WL, bit lines BL intersecting the word lines WL, and memory cells disposed at crossing points of the word lines WL and bit lines BL.

A device isolation layer 101 may be formed in a semiconductor substrate 100 to define active regions ACT. Each of the active regions ACT may have a bar shape when viewed from a plan view. A long axis of each of the active regions ACT may extend in a direction diagonal to the word lines WL and the bit lines BL when viewed from a plan view.

The word lines WL may be disposed to intersect the active regions ACT. In an embodiment, the word lines WL may be formed in recess regions recessed from a top surface of the semiconductor substrate 100 by a predetermined depth. A gate insulating layer may be disposed between the word line WL and an inner surface of the recess region. Top surfaces of the word lines WL may be disposed at a lower level than the top surface of the semiconductor substrate 100, and the recess regions on the word lines WL may be filled with an insulating material.

Source/drain regions 103 may be formed in the active regions ACT at both sides of each of the word lines WL. The source/drain regions 103 may be dopant regions doped with dopants.

Since the word lines WL and the source/drain regions 103 are formed as described above, a plurality of metal-oxide-semiconductor (MOS) transistors may be formed on a semiconductor substrate 100.

The bit lines BL may be disposed on the semiconductor substrate 100 to intersect the word lines WL. A first interlayer insulating layer 111 may be formed between the semiconductor substrate 100 and the bit lines BL, and bit line contact plugs DC may be formed in the first interlayer insulating layer 111. The bit line contact plugs DC may electrically connect some of the source/drain regions 103 to the bit lines BL.

A second interlayer insulating layer 112 may be formed to cover the bit lines BL. Contact plugs BC may be formed to penetrate the second and first interlayer insulating layers 112 and 111. The contact plugs BC may electrically connect data storage elements to others of the source/drain regions 103. In an embodiment, the contact plugs BC may be disposed on the active region ACT at both sides of the bit line BL.

In an embodiment, contact holes exposing the others of the source/drain regions may be formed to penetrate the second and first interlayer insulating layers 112 and 111, and a conductive layer may be deposited on the second interlayer insulating layer 112 to fill the contact holes. The conductive layer may be planarized to form the contact plugs BC. The contact plugs BC may be formed of one or more of polysilicon doped with dopants, a metal, a metal nitride, a metal silicide, and any combination thereof.

In an embodiment, contact pads CP may be formed on the contact plugs BC, respectively. The contact pads CP may be two-dimensionally arranged on the second interlayer insulating layer 112. Each of the contact pads CP may increase a contact area between the contact plug BC formed thereunder and a lower electrode formed thereon. The lower electrode may be included in a capacitor. In an embodiment, two contact pads CP, which may be adjacent to each other with the bit line BL interposed therebetween, may be enlarged in directions opposite to each other.

A third interlayer insulating layer 113 may fill a space between the contact pads CP. A mold layer 120 may be formed on the third interlayer insulating layer 113. A thickness of the mold layer 120 may be varied according to a height of the lower electrode of the capacitor.

According to an embodiment, the mold layer 120 may include an etch stop layer 121, a lower mold layer 123, a support layer 125 and an upper mold layer 127, which may be sequentially stacked. Here, the lower and upper mold layers 123 and 127 may be formed of silicon oxide, and the etch stop layer 121 and the support layer 125 may be formed of a material having an etch selectivity with respect to the lower and upper mold layers 123 and 127 in a dry etching process of etching the mold layer 120. For example, the etch stop layer 121 and the support layer 125 may be formed of silicon nitride. Before the formation of the upper mold layer 127, at least one through-hole may be formed to penetrate the support layer 125. The through-hole may expose the lower mold layer 123.

Referring to FIG. 14, a mask layer 140 may be formed on the mold layer 120.

According to an embodiment, first and second holes 141 and 143 may be formed in the mask layer 140. The first and second holes 141 and 143 may be formed using the method for forming fine patterns according to the aforementioned embodiment. The mask layer 140 may correspond to the etch target layer 20 of FIGS. 1B to 12B. The mold layer 120 may be etched using the mask layer 140 having the first and holes 141 and 143 as an etch mask, and lower holes 120a exposing the contact pads CP may be formed in the mold layer 120.

Figure 15:
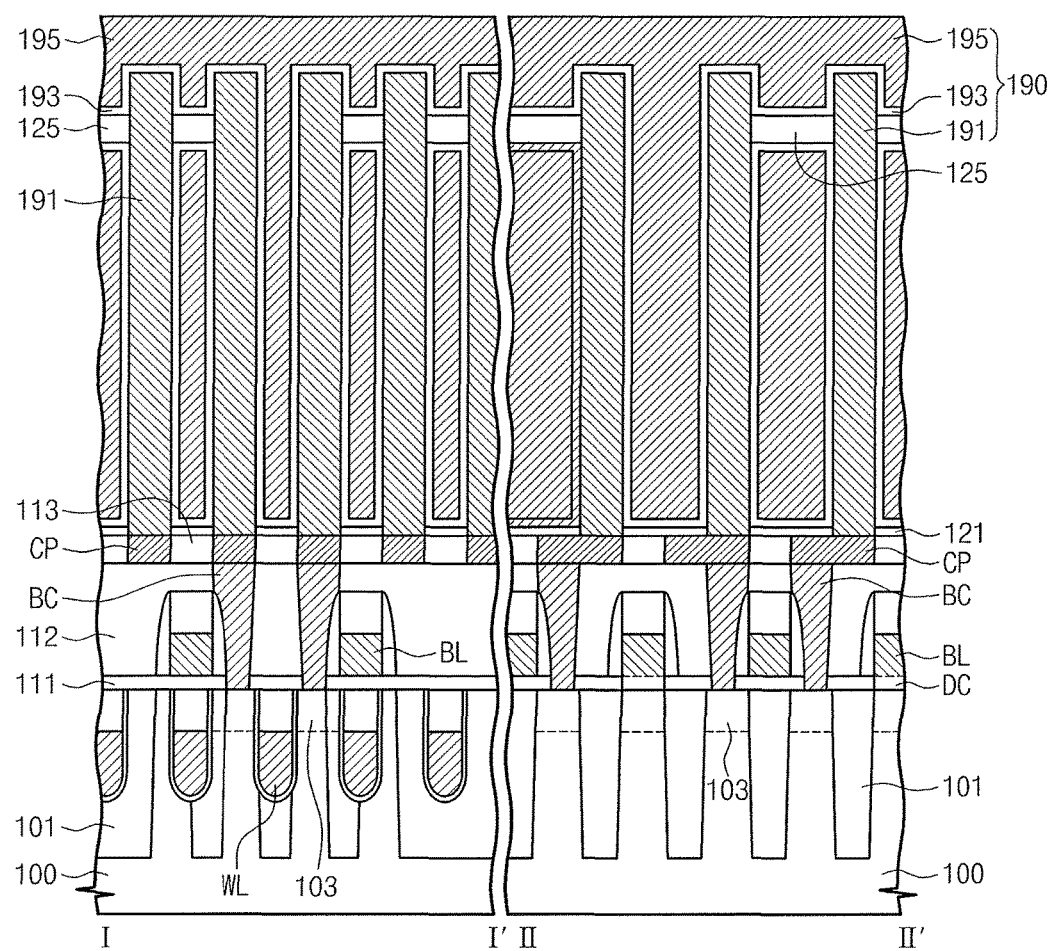

Referring to FIGS. 13, 14, and 15, lower electrodes 191 may be foamed in the lower holes 120a, respectively. In an embodiment, a conductive layer may be deposited on the mold layer 120 to conformally cover inner surfaces of the lower holes 120a, and the conductive layer disposed on a top surface of the mold layer 120 may be removed to form the cylinder-shaped lower electrode in each of the lower holes 120a, and the lower electrodes 191 may be formed to be electrically connected to the contact pads CP. The lower electrodes 191 may be arranged in a zigzag form or a honeycomb form when viewed from a plan view. After the formation of the lower electrodes 191, the lower and upper mold layers 123 and 127 may be selectively removed to expose surfaces (e.g., sidewalls) of the lower electrodes 191. Subsequently, a dielectric layer 193 may be formed to conformally cover the exposed surfaces of the lower electrodes 191, and an upper electrode 195 may be formed on the dielectric layer 193, and a capacitor 190 may be formed. The capacitor 190 may include the lower electrode 191, the upper electrode 195, and the dielectric layer 193 disposed between the lower and upper electrodes 191 and 195.

Figure 16:
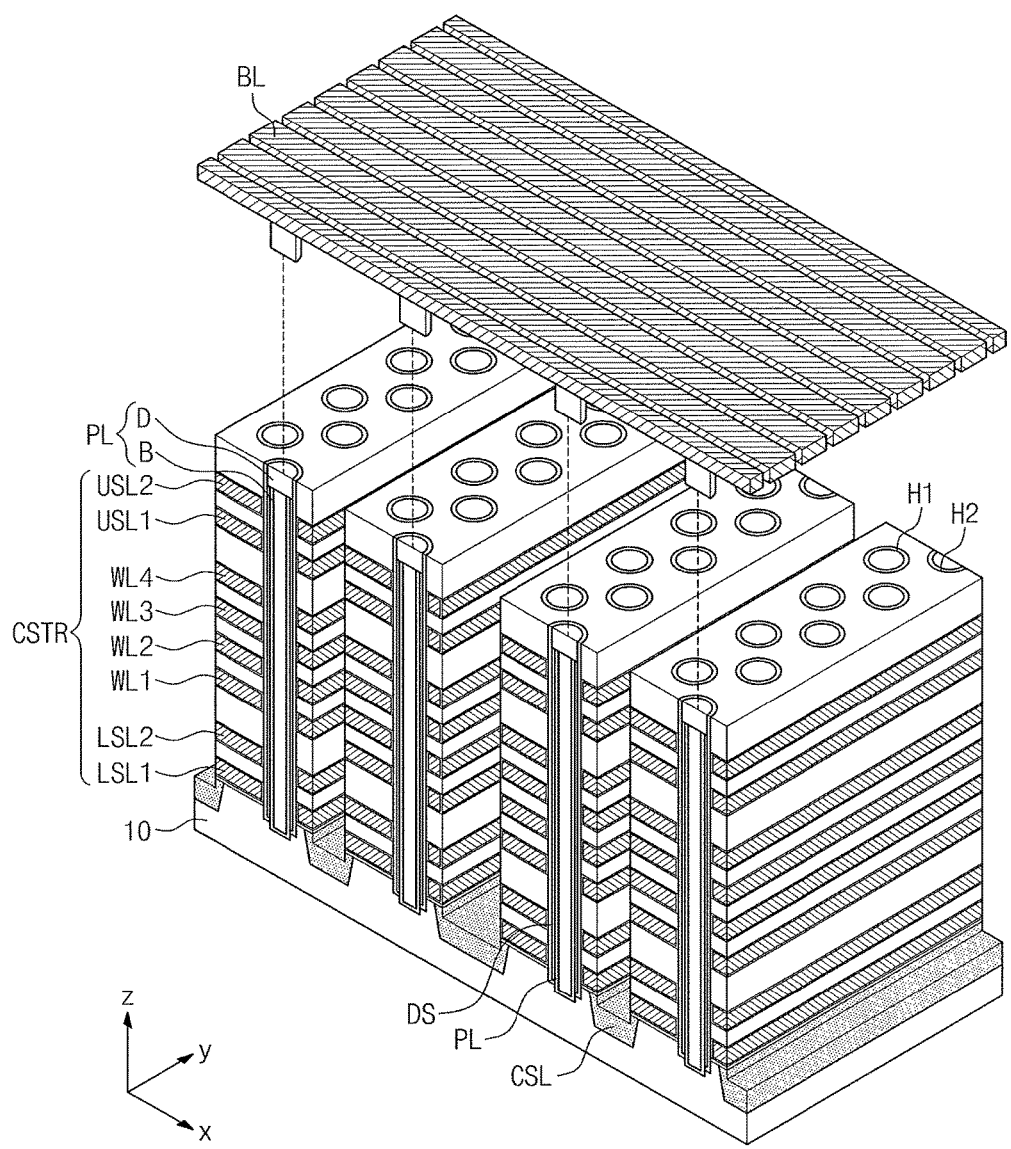
FIG. 16 illustrates a perspective view of a three-dimensional (3D) semiconductor memory device manufactured using the method for forming fine patterns according to an embodiment.

FIG. 16 illustrates a perspective view of a three-dimensional (3D) semiconductor memory device manufactured using the method for forming fine patterns according to an embodiment.

Referring to FIG. 16, a 3D semiconductor memory device according to an embodiment may include a common source line CSL, a plurality of bit lines BL, and a plurality of cell strings CSTR disposed between the common source line CSL and the bit lines BL.

The common source line CSL may be a conductive layer disposed on a substrate 10, or a dopant region formed in the substrate 10. The bit lines BL may be conductive patterns (e.g., metal lines) that are spaced apart from the substrate 10 so as to be disposed over the substrate 10. The bit lines BL may be two-dimensionally arranged and a plurality of the cell strings CSTR may be connected in parallel to each of the bit lines BL, and the cell strings CSTR may be two-dimensionally arranged on the common source line CSL or the substrate 10.

Each of the cell strings CSTR may include a plurality of lower selection lines LSL1 and LSL2, a plurality of word lines WL1 to WL4 and a plurality of upper selection lines USL1 and USL2, which may be disposed between the common source line CSL and the bit lines BL. The lower selection lines LSL1 and LSL2, the word lines WL1 to WL4, and the upper selection lines USL1 and USL2 may be conductive patterns that are stacked on the substrate 10 with insulating layers interposed therebetween.

Each of the cell strings CSTR may include a semiconductor pillar PL that vertically extends from the substrate 10 so as to be connected to the bit line BL. The semiconductor pillars PL may penetrate the lower selection lines LSL1 and LSL2, the word lines WL1 to WL4, and the upper selection lines USL1 and USL2. The semiconductor pillars PL may penetrate a plurality of conductive patterns stacked on the substrate 10. The semiconductor pillar PL may include a body portion B and a dopant region formed on one end portion or both end portions of the body portion B. For example, a drain region D may be formed in a top end portion of the semiconductor PL (e.g., between the body portion B and the bit line BL).

A data storage layer DS may be disposed between each of the semiconductor pillars PL and the word lines WL1 to WL4. In an embodiment, the data storage layer DS may include a charge storage layer. For example, the data storage layer DS may include one or more of a trap insulating layer, a floating gate electrode, and an insulating layer including conductive nano dots.

A dielectric layer used as a gate insulating layer of a transistor may be disposed between the each of the semiconductor pillars PL and the lower selection lines LSL 1 and LSL2 and/or between each of the semiconductor pillars PL and the upper selection lines USL1 and USL2. In an embodiment, the dielectric layer may be formed of the same material as the data storage layer DS or may be formed of a gate insulating layer (e.g., a silicon oxide layer) of a general MOS field effect transistor (MOSFET).

In the structure described above, the semiconductor pillars PL and the lines LSL1 and LSL2, WL1 to WL4 and USL1 and USL2 may constitute MOSFETs using the semiconductor pillars PL as channel regions. In an embodiment, the semiconductor pillars PL and the lines LSL1 and LSL2, WL1 to WL4 and USL1 and USL2 may constitute may constitute MOS capacitors. Each of the cell strings CSTR may include lower selection transistors formed by the lower selection lines LSL1 and LSL2, cell transistors formed by the word lines WL1 to WL4 and upper selection transistors formed by the upper selection lines USL1 and USL2, which may be connected in series.

In the 3D semiconductor memory device including the semiconductor pillars PL described above, the semiconductor pillars PL may be formed using the method for forming fine patterns according to the above mentioned embodiment.

A stack structure may be formed to include insulating layers and conductive layers (or sacrificial layers), which may be alternately and repeatedly stacked on the substrate 10. The insulating layers and the conductive layers (or sacrificial layers) may be formed to realize the lines LSL1 and LSL2, WL1 to WL4 and USL1 and USL2. The stack structure may correspond to the substrate 10 of FIGS. 1B to 12B or the mold layer 120 of FIG. 14. Vertical holes H1 and H2 may be formed in the stack structure by means of a mask layer having first and second holes. The mask layer having the first and second holes may correspond to the etch target layer 20 described with reference to FIGS. 1A to 12A and 1B to 12B. The mask layer having the first and second holes may be formed by a method that is the same as or similar to the method described with reference to FIGS. 1A to 12A and 1B to 12B. Thereafter, the data storage layer DS and the semiconductor pillars PL may be formed in the vertical holes H1 and H2.

Figure 17:
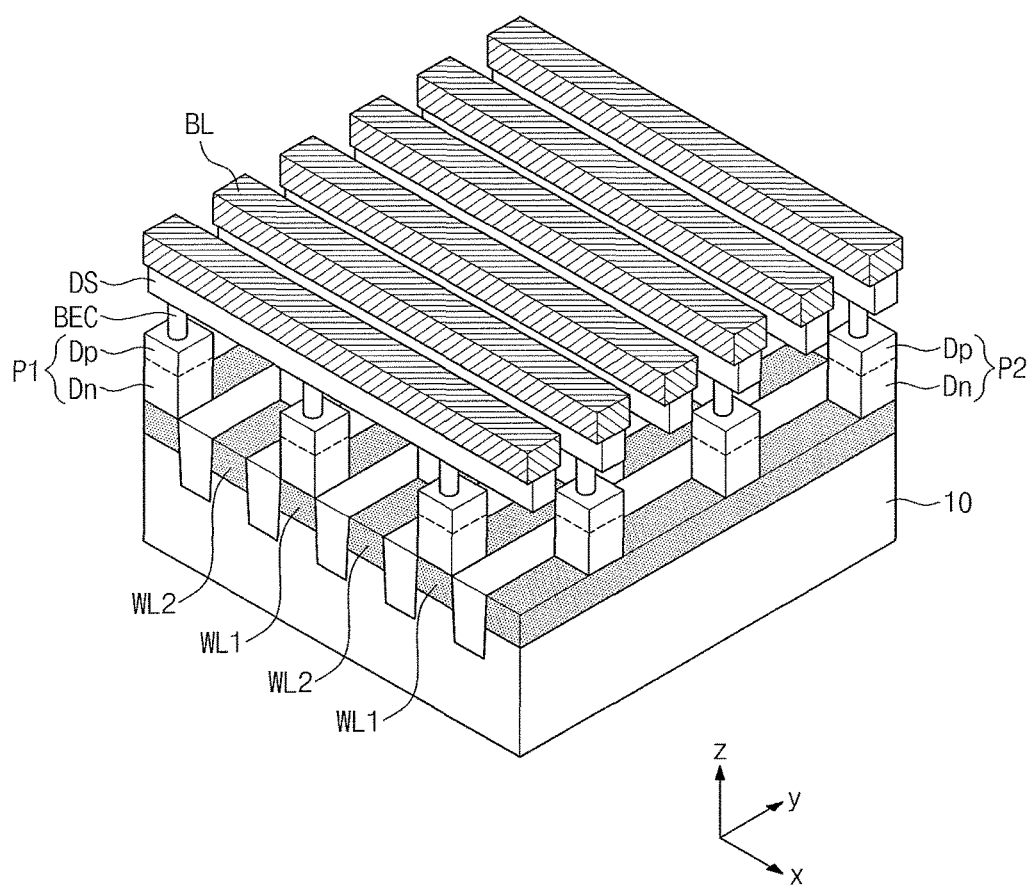
FIG. 17 illustrates a perspective view of a variable resistance memory device manufactured using the method for forming fine patterns according to an embodiment.

FIG. 17 illustrates a perspective view of a variable resistance memory device manufactured using the method for forming fine patterns according to an embodiment.

Referring to FIG. 17, a semiconductor memory device may include lower interconnections WL1 and WL2 on a semiconductor substrate 10, upper interconnections BL crossing over the lower interconnections WL1 and WL2, selection elements respectively disposed at crossing points of the lower interconnections WL1 and WL2 and the upper interconnection BL, a memory element disposed between each of the selection elements and the upper interconnection BL. The selection elements may be two-dimensionally arranged on the semiconductor substrate 10 and may control a flow of a current passing through the memory element.

The lower interconnections WL1 and WL2 may have linear shapes extending in a y-axis direction. In an embodiment, the lower interconnections WL1 and WL2 may be dopant regions that are heavily doped with dopants in the semiconductor substrate 10. Here, a conductivity type of the lower interconnections WL1 and WL2 may be opposite to that of the semiconductor substrate 10.

In the present embodiment, the selection elements may include first and second semiconductor patterns P1 and P2 that are formed using the method for forming fine patterns according to the aforementioned embodiment. The first and second semiconductor patterns P1 and P2 may be formed using an etching process which uses the mask layer having the first and second holes as an etch mask.

Each of the first and second semiconductor patterns P1 and P2 may include an upper dopant region Dp and a lower dopant region Dn which have conductivity types opposite to each other. For example, the lower dopant region Dn may have the same conductivity type as the lower interconnections WL1 and WL2, and the conductivity type of the upper dopant region Dp may be opposite to the that of the lower dopant region Dn, and a PN junction may be formed in each of the first and second semiconductor patterns P1 and P2. In an embodiment, an intrinsic region may be disposed between the upper dopant region Dp and the lower dopant region Dn, and a PIN junction may be formed in each of the first and second semiconductor patterns P1 and P2. In an embodiment, a PNP or NPN bipolar transistor may be realized by the semiconductor substrate 10, the lower interconnection WL1 or WL2, and the semiconductor pattern P1 or P2.

Bottom electrodes BEC, the memory elements DS, and the upper interconnections BL may be disposed on the first and second semiconductor patterns P1 and P2. The upper interconnections BL may cross over the lower interconnections WL1 and WL2 and may be disposed on the memory elements DS so as to be electrically connected to the memory elements DS.

According to an embodiment, each of the memory elements DS may be formed to be substantially parallel to the upper interconnection BL and may be connected to a plurality of bottom electrodes BEC. In an embodiment, the memory elements DS may be two-dimensionally arranged. The memory elements DS may be disposed on the first to second semiconductor patterns P1 and P2 in one-to-one correspondence. The memory element DS may be a variable resistance pattern which is switchable between two resistance states by an electric pulse applied thereto. In an embodiment, the memory element DS may include a phase-change material of which a phase may be changed according to a current amount. In an embodiment, the memory element DS may include one or more of perovskite compounds, transition metal oxides, magnetic materials, ferromagnetic materials, and antiferromagnetic materials.

Each of the bottom electrodes BEC may be disposed between each of the first and second semiconductor patterns P1 and P2 and one of the memory elements DS. A planar area of the bottom electrode BEC may be smaller than that of each of the first and second semiconductor patterns P1 and P2 and/or that of the memory element DS.

In an embodiment, each of the bottom electrodes BEC may have a pillar shape.

In an embodiment, the shape of the bottom electrode BEC may be variously modified to reduce a cross-sectional area of the bottom electrode BEC. For example, the bottom electrode BEC may have a three-dimensional structure such as a U-shape, an L-shape, a hollow cylinder shape, a ring shape, or a cup shape.

An ohmic layer may be disposed between each of the bottom electrodes BEC and each of the first and second semiconductor patterns P1 and P2 to reduce a contact resistance. For example, the ohmic layer may include a metal silicide layer such as a titanium silicide layer, a cobalt silicide layer, a tantalum silicide layer, or a tungsten silicide layer.

Figure 18:
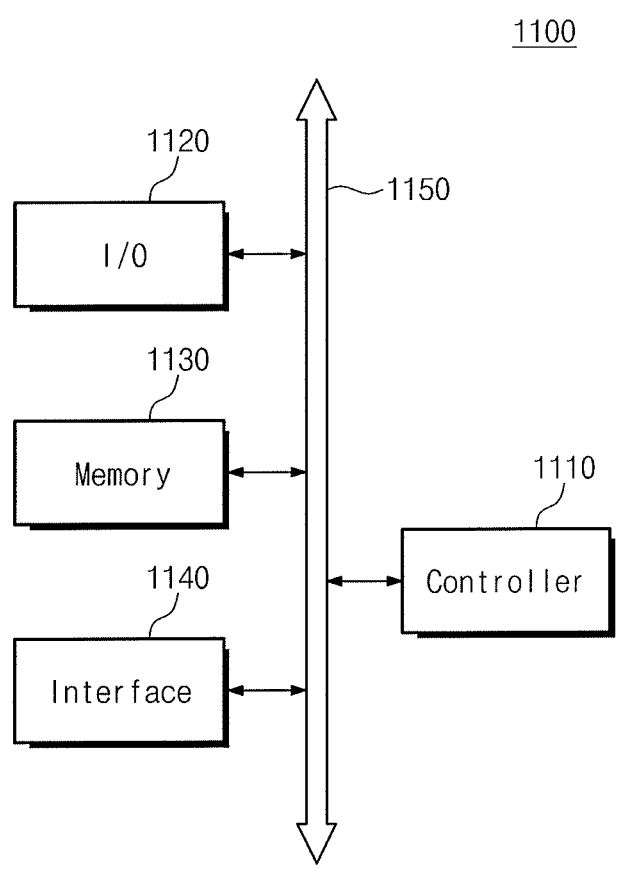
FIG. 18 illustrates a schematic block diagram of an example of an electronic system including a semiconductor device manufactured using the method for forming fine patterns according to an embodiment.

FIG. 18 illustrates a schematic block diagram of an example of an electronic system including a semiconductor device manufactured using the method for forming fine patterns according to an embodiment.

Referring to FIG. 18, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include at least one of the semiconductor devices of the aforementioned embodiments.

The controller 1110 may include one or more of a microprocessor, a digital signal processor, a microcontroller, and another logic device having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 19:
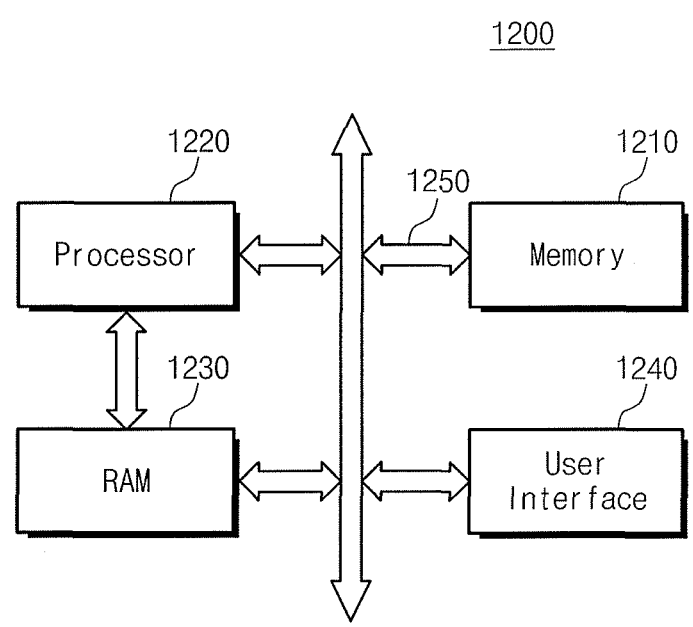
FIG. 19 illustrates a schematic block diagram of an example of an electronic system including a semiconductor device manufactured using the method for forming fine patterns according to an embodiment.

FIG. 19 illustrates a schematic block diagram of an example of an electronic system including a semiconductor device manufactured using the method for forming fine patterns according to an embodiment.

Referring to FIG. 19, an electronic system 1200 may include at least one of the semiconductor devices according to the aforementioned embodiments. For example, the electronic system 1200 may include a memory system 1210, a processor 1220, a RAM 1230, and a user interface unit 1240. At least two of the memory system 1210, the processor 1220, the RAM 1230, and the user interface unit 1240 may communicate with each other through a data bus 1250. The processor 1220 may execute programs and may control the electronic system 1200. The RAM 1230 may be used as a working memory of the processor 1220. For example, each of the processor 1220 and the RAM 1230 may include at least one of the semiconductor devices according to the above mentioned embodiments. In an embodiment, the processor 1220 and the RAM 1230 may be included in one package. The user interface unit 1240 may be used when data are transmitted to or outputted from the electronic system 1200. The memory system 1210 may store codes for operations of the processor 1220, data processed by the processor 1220, and/or data inputted from an external system. The memory system 1210 may include a controller and a memory device. In an embodiment, the memory system 1210 may be realized as a memory card.

The electronic system 1200 may be realized as a mobile system, a personal computer, an industrial computer, or a logic system performing various functions. For example, the mobile system may be one of a PDA, a portable computer, a web tablet, a mobile phone, a wireless phone, a laptop computer, a memory card, a digital music system, or an information transmitting/receiving system. If the electronic system 1200 is a system capable of performing wireless communication, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

By way of summation and review, a photolithography process may be used to form fine patterns arranged in a zigzag or honeycomb form in a semiconductor device. As design rules of semiconductor devices may be reduced, a double patterning technique (DPT) may form fine patterns having sizes smaller than a minimum feature realized by the photolithography process. A direct self-assembly (DSA) process using a block copolymer may reduce manufacture costs of semiconductor devices.

According to embodiments, pillars used as guide patterns may be formed using a photolithography process and an etching process, and phase-separation of the block copolymer may be induced using the pillars, and first contacts may be formed. Thereafter, second contacts may be formed using openings formed by removing the pillars.

According to an embodiment, fine patterns may be formed using a single photolithography process, the DSA process, and a pillar reverse process, unlike a comparative method using a first photolithography process, a first DPT process, a second photolithography process and a second DPT process, so a manufacturing cost of a semiconductor device may be reduced and processes may be simplified. It may be possible to prevent the block copolymer from being phase-separated in a peripheral region surrounding a cell region, and sizes and widths of some of contact plugs may be controlled independently of those of others of the contact plugs. Furthermore, an edge region of the cell region may be controlled, and an overlay margin may be improved.

Embodiments relate to a method for forming fine patterns of a semiconductor device by using a block copolymer. Provided is a method that may form fine patterns using a self-assembly nano structure that may be used to form nano-sized patterns.

Embodiments may provide a method for forming fine patterns capable of improving uniformity. Embodiments may provide a method for forming fine patterns capable of reducing a manufacture cost.

According to an embodiment, the fine patterns may be formed by simplified processes, the manufacture cost of the semiconductor device may be reduced, and the process efficiency of the semiconductor device may be improved. The sizes and the density of the holes may be independently controlled, and a boundary of the trimming process may be designated to improve the overlay margin.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for forming fine patterns, the method comprising:
    patterning a hard mask layer on an etch target layer to form sacrificial pillars and a first opening between the sacrificial pillars, the first opening exposing the etch target layer;
    forming a block copolymer layer on the etch target layer exposed through the first opening, the block copolymer layer including first and second polymer blocks;
    phase-separating the block copolymer layer to form first block patterns and a second block pattern, the first block patterns spaced apart from the sacrificial pillars, the first block patterns including the first polymer block, the second block pattern surrounding the sacrificial pillars and the first block patterns, and the second block pattern including the second polymer block;
    forming first holes by etching the etch target layer exposed by removing the first block patterns; and
    forming second holes by etching the etch target layer exposed through second openings formed by removing the sacrificial pillars, the second holes being different from the first holes.

2. The method as claimed in claim 1, wherein forming the second holes includes:
    forming a coating layer exposing the sacrificial pillars on the etch target layer in which the first holes are formed;
    removing the sacrificial pillars to form the second openings;
    conformally forming a spacer layer along a profile of the second openings and the coating layer; and
    forming the second holes in the etch target layer by anisotropically etching the spacer layer to expose a top surface of the coating layer.

3. The method as claimed in claim 2, wherein forming the second holes in the etch target layer includes:
    anisotropically etching the spacer layer to expose at least a portion of the etch target layer; and
    etching the exposed etch target layer to form the second holes.

4. The method as claimed in claim 2, wherein one or more of a thickness of the spacer layer and sizes of the sacrificial pillars is controlled to adjust sizes of the second holes.

5. The method as claimed in claim 1, wherein the hard mask layer is patterned using a photolithography process defining a mask pattern.

6. The method as claimed in claim 1, wherein concentrations of the first polymer block and the second polymer block are controlled to adjust sizes of the first holes.

7. The method as claimed in claim 1, wherein:
    the etch target layer is on a substrate including a first region and a second region surrounding the first region,
    the sacrificial pillars and the first opening are on the substrate of the first region, and
    a portion of the hard mask layer remains on the substrate of the second region.

8. The method as claimed in claim 7, wherein:
    the hard mask layer includes a first sub-hard mask layer and a second sub-hard mask layer that are sequentially stacked, and
    the sacrificial pillars correspond to portions of the first sub-hard mask layer, respectively.

9. The method as claimed in claim 8, wherein patterning the hard mask layer includes:
    forming mask patterns on the hard mask layer;
    etching the second and first sub-hard mask layers using the mask patterns as etch masks; and
    removing the second sub-hard mask layer and the mask patterns, the second sub-hard mask layer and the mask patterns being on the sacrificial pillars.

10. The method as claimed in claim 9, wherein removing the second sub-hard mask layer and the mask patterns includes exposing the first sub-hard mask layer of the second region.

11. The method as claimed in claim 10, wherein the first block patterns are in only the first region.

12. The method as claimed in claim 10, wherein the first sub-hard mask layer includes silicon, silicon oxide, polysilicon, silicon oxynitride, silicon nitride, silicon carbonitride, and/or silicon carbide.

13. The method as claimed in claim 12, wherein the second sub-hard mask layer includes a spin-on-hardmask layer and/or an amorphous carbon layer.

14. The method as claimed in claim 1, wherein each of the first block patterns is between at least three sacrificial pillars adjacent to each other.

15. The method as claimed in claim 1, wherein each of the first block patterns has a cylindrical shape.

16. A method for forming a first block pattern and a second block pattern on an etch target layer, the method comprising:
    forming a block copolymer layer on the etch target layer between pillars on the etch target layer, the block copolymer including a first polymer block and a second polymer block, the pillars including one or more silicon-based materials; and
    dividing the block copolymer layer into a region including the first polymer block and another region including the second polymer block using a thermal treatment process.

17. The method as claimed in claim 16, wherein:
    the molar volume ratio of the first polymer block to the second polymer block is in a range of 0.2:0.8 to 0.35:0.65, and
    the region including the first polymer block surrounds the region including the second polymer block.

18. A method for etching an etch target layer, the method comprising:
    forming a block copolymer layer on an etch target layer, the block copolymer including a first polymer block and a second polymer block;
    dividing the block copolymer layer into a region including the first polymer block and regions including the second polymer block;
    removing the regions including the second polymer block to form empty regions, portions of the etch target layer being exposed through the empty regions; and
    etching the etch target layer using the region including the first polymer block as an etch mask to form first holes in the etch target layer at the empty regions.

19. The method as claimed in claim 18, wherein removing the regions including the second polymer block to form empty regions includes using an oxygen plasma treatment, an ozone treatment, an ultraviolet irradiation treatment, a pyrolysis treatment, and/or a chemical decomposition treatment.

20. The method as claimed in claim 18, wherein:
the molar volume ratio of the first polymer block to the second polymer block is in a range of 0.2:0.8 to 0.35:0.65, and
the region including the first polymer block surrounds the regions including the second polymer block.

* * * * *